(12) United States Patent
Minami et al.

(10) Patent No.: US 10,752,807 B2
(45) Date of Patent: Aug. 25, 2020

(54) SLURRY, POLISHING-LIQUID SET, POLISHING LIQUID, METHOD FOR POLISHING SUBSTRATE, AND SUBSTRATE

(71) Applicant: HITACHI CHEMICAL COMPANY, LTD., Tokyo (JP)

(72) Inventors: Hisataka Minami, Tokyo (JP); Tomohiro Iwano, Tokyo (JP); Keita Arakawa, Tokyo (JP); Takahiro Hidaka, Tokyo (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 14/917,903

(22) PCT Filed: Jul. 1, 2014

(86) PCT No.: PCT/JP2014/067570
§ 371 (c)(1),
(2) Date: Mar. 9, 2016

(87) PCT Pub. No.: WO2015/037311
PCT Pub. Date: Mar. 19, 2015

(65) Prior Publication Data
US 2016/0222252 A1     Aug. 4, 2016

(30) Foreign Application Priority Data

Sep. 10, 2013  (JP) ................................. 2013-187493

(51) Int. Cl.
*C09G 1/02* (2006.01)
*H01L 21/304* (2006.01)
(Continued)

(52) U.S. Cl.
CPC .............. *C09G 1/02* (2013.01); *C09K 3/1409* (2013.01); *C09K 3/1463* (2013.01); *H01L 21/31053* (2013.01); *H01L 21/31055* (2013.01)

(58) Field of Classification Search
None
See application file for complete search history.

(56) References Cited

U.S. PATENT DOCUMENTS

| 9,163,162 B2 * | 10/2015 | Akutsu | ................ C09K 3/1409 |
| 2006/0143990 A1 * | 7/2006 | Ono | ........................ C09G 1/02 51/307 |

(Continued)

FOREIGN PATENT DOCUMENTS

| CN | 1386632 A | 12/2002 |
| CN | 101622695 A | 1/2010 |

(Continued)

OTHER PUBLICATIONS

International Search Report for PCT/JP2014/067570 dated Oct. 7, 2014; English translation submitted herewith (4 pages).

(Continued)

*Primary Examiner* — Shamim Ahmed
(74) *Attorney, Agent, or Firm* — Fitch, Even, Tabin & Flannery, L.L.P.

(57) ABSTRACT

A polishing liquid comprises: abrasive grains; a compound having an aromatic heterocycle; an additive (excluding the compound having an aromatic heterocycle); and water, wherein: the abrasive grains include a hydroxide of a tetravalent metal element; the aromatic heterocycle has an endocyclic nitrogen atom not bound to a hydrogen atom; and a charge of the endocyclic nitrogen atom obtained by using the Merz-Kollman method is −0.45 or less.

37 Claims, 3 Drawing Sheets

(51) Int. Cl.
*H01L 21/461* (2006.01)
*C09K 3/14* (2006.01)
*H01L 21/3105* (2006.01)

(56) References Cited

U.S. PATENT DOCUMENTS

| | | | |
|---|---|---|---|
| 2006/0203535 A1* | 9/2006 | Ishii | G02F 1/15 365/151 |
| 2007/0224919 A1* | 9/2007 | Li | C09G 1/02 451/41 |
| 2007/0290165 A1* | 12/2007 | Hou | C09K 3/1463 252/79.1 |
| 2009/0090888 A1* | 4/2009 | Chang | C09G 1/02 252/79.1 |
| 2011/0039475 A1* | 2/2011 | Hoshi | B24B 37/044 451/28 |
| 2011/0062376 A1* | 3/2011 | Reiss | C09G 1/02 252/79.5 |
| 2012/0058642 A1* | 3/2012 | White | C09G 1/02 438/693 |
| 2012/0129346 A1* | 5/2012 | Ryuzaki | B24B 37/044 438/693 |
| 2012/0270400 A1* | 10/2012 | Takegoshi | C09G 1/02 438/692 |
| 2012/0329371 A1* | 12/2012 | Iwano | C09G 1/02 451/56 |
| 2014/0017892 A1* | 1/2014 | Ward | H01L 21/31116 438/693 |

FOREIGN PATENT DOCUMENTS

| | | |
|---|---|---|
| CN | 102725373 A | 10/2012 |
| JP | 2007-311779 A | 11/2007 |
| TW | 201229166 A | 7/2012 |
| WO | 02/067309 A1 | 8/2002 |
| WO | 2011/111421 | 9/2011 |
| WO | 2012/070541 A1 | 5/2012 |
| WO | 2012/070542 A1 | 5/2012 |
| WO | 2012/070544 A1 | 5/2012 |
| WO | 2013/125446 A1 | 8/2013 |

OTHER PUBLICATIONS

International Preliminary Report in on Patentability in counterpart WO Appln. PCT/JP2014/067570 dated Mar. 24, 2016 in English.
Office Action of counterpart CN Patent Application No. 201480049482.8 dated May 2, 2017.
Office Action of TW Patent Application No. 103123831 dated Sep. 21, 2017.
Office Action dated Jul. 10, 2019 in U.S. Appl. No. 14/379,954.

* cited by examiner (a)

(b)

SLURRY, POLISHING-LIQUID SET, POLISHING LIQUID, METHOD FOR POLISHING SUBSTRATE, AND SUBSTRATE

CROSS-REFERENCE TO RELATED APPLICATIONS

This application is a U.S. national phase application filed under 35 U.S.C. § 371 of International Application No. PCT/JP2014/067570, filed Jul. 1, 2014, designating the United States, which claims priority from Japanese Patent Application No. 2013-187493, filed Sep. 10, 2013, which are hereby incorporated herein by reference in their entirety.

TECHNICAL FIELD

The present invention relates to a slurry, a polishing-liquid set, a polishing liquid, a polishing method of a base, and a base. In particular, the present invention relates to a slurry, a polishing-liquid set, a polishing liquid, a polishing method of a base, and a base, which are used in manufacturing steps of semiconductor elements.

BACKGROUND ART

As manufacturing techniques for ULSI semiconductor elements, processing techniques for densification and miniaturization of the semiconductor elements have been presently researched and developed. A CMP (Chemical Mechanical Polishing) technique is one of such processing techniques. A flattening technique using CMP has become an essential technique for flattening interlayer insulating materials, forming STI (Shallow Trench Isolation), forming plugs, forming embedded metal wires (damascene step) and the like, in manufacturing steps of semiconductor elements. Generally, a CMP step (a flattening step using a CMP technique) is performed by supplying a polishing liquid for CMP between a polishing pad (polishing cloth) and a material to be polished of a base and by polishing the material to be polished with the polishing pad.

Various polishing liquids have been known as the polishing liquid for CMP used for CMP. When the polishing liquid for CMP is classified according to the kinds of abrasive grains (polishing particles), a ceria-based polishing liquid comprising cerium oxide (ceria) particles, a silica-based polishing liquid comprising silicon oxide (silica) particles, an alumina-based polishing liquid comprising aluminum oxide (alumina) particles, and a resin particle-based polishing liquid comprising organic resin particles, or the like have been known.

Incidentally, in recent years, achievement of further miniaturization of wires has been required in manufacturing steps of semiconductor elements, and polishing scratches generated during polishing have become a problem. Specifically, when polishing is performed using conventional polishing liquids, generation of fine polishing scratches gives no problem as long as the size of the polishing scratches is smaller than the conventional wire width, but becomes a problem in the case where further miniaturization of wires is tried to be achieved.

For this problem, the average particle diameter of abrasive grains comprised in the polishing liquid is tried to be reduced. However, if the average particle diameter is reduced, the polishing rate may be decreased due to a decrease in the mechanical action. In this way, both a polishing rate and polishing scratches are extremely difficult to be achieved. In response to this, polishing liquids using abrasive grains including a hydroxide of a tetravalent metal element have been studied (for example, refer to the following Patent Literature 1 to 4).

CITATION LIST

Patent Literature

Patent Literature 1: International Publication No. WO 02/067309
Patent Literature 2: International Publication No. WO 2012/070541
Patent Literature 3: International Publication No. WO 2012/070542
Patent Literature 4: International Publication No. WO 2012/070544

SUMMARY OF INVENTION

Technical Problem

The present inventors found that, in a slurry using abrasive grains including a hydroxide of a tetravalent metal element, and a polishing liquid obtained by using the slurry, ions may be emitted from the abrasive grains with time. When the ions are emitted from the abrasive grains as described above, the ions which are not required for polishing are mixed in the slurry or the polishing liquid, or the abrasive grains themselves change, and therefore, a fluctuation in polishing properties may be caused.

After a slurry comprising abrasive grains is mixed with an additive solution including an additive immediately before polishing to obtain a polishing liquid, polishing may be performed using the polishing liquid. At this time, the conductivity of the polishing liquid after mixing may be measured as a method for continuously and simply confirming that the slurry and the additive solution are mixed at a preliminarily set mixing ratio. This method is premised on the constant or mostly unchanged conductivities of the slurry and additive solution. However, when the conductivity of the slurry itself is fluctuated by the emission of the ions from the abrasive grains as described above, such a method cannot be used, resulting in difficult process management.

The present invention aims to solve the above-described problems, and it is an object of the present invention to provide a slurry, a polishing-liquid set, and a polishing liquid which have excellent stability of abrasive grains (for example, the amount of change over time in conductivity is reduced). It is another object of the present invention to provide a method for polishing a base using the slurry, the polishing-liquid set or the polishing liquid, and a base obtained by the polishing method.

Solution to Problem

The present inventors made extensive research on a slurry using abrasive grains including a hydroxide of a tetravalent metal element, and as a result, conceived the idea of improving the stability of the abrasive grains including a hydroxide of a tetravalent metal element using a specific compound having an aromatic heterocycle.

Specifically, a slurry of the present invention comprises: abrasive grains; a compound having an aromatic heterocycle; and water, wherein the abrasive grains include a hydroxide of a tetravalent metal element, the aromatic heterocycle has an endocyclic nitrogen atom not bound to a hydrogen atom, and a charge (MK charge) of the endocyclic nitrogen atom obtained by using the Merz-Kollman method (MK method) is −0.45 or less.

According to the slurry of the present invention, excellent stability of the abrasive grains is obtained. For example, according to the slurry of the present invention, ions emitted from the abrasive grains with time are less than those in the conventional technique, and thus, a change over time in conductivity of the slurry (specifically, a change in the content of ions in the slurry) can be suppressed.

Moreover, according to the slurry of the present invention, in the case where a polishing liquid obtained by adding an additive to the slurry is used, a material to be polished can be polished at an excellent polishing rate while maintaining an addition effect of an additive. Furthermore, in the case where the slurry of the present invention is used for polishing without adding an additive, a material to be polished can be polished at an excellent polishing rate. Moreover, according to the slurry of the present invention, the abrasive grains include a hydroxide of a tetravalent metal element so that generation of polishing scratches can also be suppressed.

Moreover, the present inventors found that a material to be polished can be polished at a further excellent polishing rate in the ease where the content of a non-volatile component of a liquid phase obtained when an aqueous dispersion containing a specific amount of abrasive grains is centrifuged at a specific centrifugal acceleration is high. Specifically, in a slurry of the present invention, the abrasive grains preferably produce a liquid phase having a content of a non-volatile component of 500 ppm or more when an aqueous dispersion having a content of the abrasive grains adjusted to 1.0 mass % is centrifuged for 50 minutes at a centrifugal acceleration of $1.59 \times 10^5$ G It is to be noted that "ppm" means mass ppm, that is, "parts per million mass".

Furthermore, the present inventors found that a material to be polished can be polished at a further excellent polishing rate in the case where light transmittance for light having a specific wavelength is high in an aqueous dispersion containing a specific amount of the abrasive grains. Specifically, in the slurry of the present invention, the abrasive grains preferably produce light transmittance of 50%/cm or more for light having a wavelength of 500 nm in an aqueous dispersion having a content of the abrasive grains adjusted to 1.0 mass %.

In the slurry of the present invention, the abrasive grains preferably produce absorbance of 1.00 or more for light having a wavelength of 400 nm in an aqueous dispersion having a content of the abrasive grains adjusted to 1.0 mass %. In this case, a material to be polished can be polished at a further excellent polishing rate.

In the slurry of the present invention, the abrasive grains preferably produce absorbance of 1.000 or more for light having a wavelength of 290 nm in an aqueous dispersion having a content of the abrasive grains adjusted to 0.0065 mass % (65 ppm). In this case, a material to be polished can be polished at a further excellent polishing rate.

In the slurry of the present invention, the abrasive grains preferably produce absorbance of 0.010 or less for light having a wavelength of 450 to 600 nm in an aqueous dispersion having a content of the abrasive grains adjusted to 0.0065 mass %. In this case, a material to be polished can be polished at a further excellent polishing rate.

In the slurry of the present invention, the hydroxide of a tetravalent metal element is preferably obtained by reacting a salt of a tetravalent metal element with an alkali source. In this case, particles having an extremely fine particle diameter can be obtained, and thus, an effect of reducing polishing scratches can be further improved.

In the slurry of the present invention, the tetravalent metal element is preferably tetravalent cerium. In this case, high chemical activity can be obtained, and thus, a material to be polished can be polished at a further excellent polishing rate.

Moreover, the present inventors found that, in a polishing liquid comprising an additive in addition to the constituent components of the above-described slurry, by using together abrasive grains including a hydroxide of a tetravalent metal element and a specific compound having an aromatic heterocycle, excellent stability of the abrasive grains can be obtained, and a reduction in a polishing rate of a material to be polished due to the addition of the additive can be suppressed.

Specifically, in the polishing-liquid set of the present invention, constituent components of a polishing liquid are separately stored as a first liquid and a second liquid such that the first liquid and the second liquid are mixed to form the polishing liquid, the first liquid is the above-described slurry, and the second liquid comprises an additive (excluding the compound having an aromatic heterocycle), and water.

According to the polishing-liquid set of present invention, excellent stability of the abrasive grains is obtained. For example, according to the polishing-liquid set of the present invention, ions emitted from the abrasive grains with time are less than those in the conventional technique, and thus, a change over time in conductivity (specifically, a change in the content of ions) can be suppressed.

Moreover, according to the polishing-liquid set of the present invention, a material to be polished can be polished at an excellent polishing rate while maintaining an addition effect of an additive. Furthermore, according to the polishing-liquid set of the present invention, the abrasive grains include a hydroxide of a tetravalent metal element, and thus, generation of polishing scratches can also be suppressed.

A polishing liquid of the present invention comprises: abrasive grains; a compound having an aromatic heterocycle; an additive (excluding the compound having an aromatic heterocycle); and water, wherein the abrasive grains include a hydroxide of a tetravalent metal element, the aromatic heterocycle has an endocyclic nitrogen atom not bound to a hydrogen atom, and a charge of the endocyclic nitrogen atom obtained by using the Merz-Kollman method is −0.45 or less.

According to the polishing liquid of the present invention, excellent stability of the abrasive grains is obtained. For example, according to the polishing liquid of the present invention, ions emitted from the abrasive grains with time are less than those in the conventional technique, and thus, a change over time in conductivity of the polishing liquid (specifically, a change in the content of ions in the polishing liquid) can be suppressed.

According to the polishing liquid of the present invention, a material to be polished can be polished at an excellent polishing rate while maintaining an addition effect of an additive. Furthermore, according to the polishing liquid of the present invention, the abrasive grains include a hydroxide of a tetravalent metal element so that generation of polishing scratches can also be suppressed.

Moreover, the present inventors found that a material to be polished can be polished at a further excellent polishing rate in the case where the content of a non-volatile component of a liquid phase obtained when an aqueous dispersion containing a specific amount of the abrasive grains is centrifuged at a specific centrifugal acceleration is high. Specifically, in the polishing liquid of the present invention, the abrasive grains preferably produce a liquid phase having a content of a non-volatile component of 500 ppm or more when an aqueous dispersion having a content of the abrasive grains adjusted to 1.0 mass % is centrifuged for 50 minutes at a centrifugal acceleration of $1.59 \times 10^5$ G.

Furthermore, the present inventors found that a material to be polished can be polished at a further excellent polishing rate in the case where light transmittance for light having a specific wavelength is high in an aqueous dispersion containing a specific amount of abrasive grains. Specifically, in the polishing liquid of the present invention, the abrasive grains preferably produce light transmittance of 50%/cm or more for light having a wavelength of 500 nm in an aqueous dispersion having a content of the abrasive grains adjusted to 1.0 mass %.

In the polishing liquid of the present invention, the abrasive grains preferably produce absorbance of 1.00 or more for light having a wavelength of 400 nm in an aqueous dispersion having a content of the abrasive grains adjusted to 1.0 mass %. In this case, a material to be polished can be polished at a further excellent polishing rate.

In the polishing liquid of the present invention, the abrasive grains preferably produce absorbance of 1.000 or more for light having a wavelength of 290 nm in an aqueous dispersion having a content of the abrasive grains adjusted to 0.0065 mass % (65 ppm). In this case, a material to be polished can be polished at a further excellent polishing rate.

In the polishing liquid of the present invention, the abrasive grains preferably produce absorbance of 0.010 or less for light having a wavelength of 450 to 600 nm in an aqueous dispersion having a content of the abrasive grains adjusted to 0.0065 mass %. In this case, a material to be polished can be polished at a further excellent polishing rate.

In the polishing liquid of the present invention, the hydroxide of a tetravalent metal element is preferably obtained by reacting a salt of a tetravalent metal element with an alkali source. In this case, particles having an extremely fine particle diameter can be obtained, and thus, an effect of reducing polishing scratches can be further improved.

In the polishing liquid of the present invention, the tetravalent metal element is preferably tetravalent cerium. In this case, high chemical activity can be obtained, and thus, a material to be polished can be polished at a further excellent polishing rate.

Moreover, the present invention provides polishing methods of a base using the above-described slurry, the above-described polishing-liquid set or the above-described polishing liquid. According to these polishing methods, excellent stability of the abrasive grains can be obtained and a material to be polished can be polished at an excellent polishing rate. Moreover, according to these polishing methods, generation of polishing scratches can be suppressed, and a base which excels in flatness can also be obtained.

A first embodiment of the polishing methods of the present invention relates to a polishing method using the above-described slurry. Specifically, the polishing method of the first embodiment comprises a step of arranging a material to be polished of a base having the material to be polished on its surface so as to be opposed to a polishing pad, and a step of supplying the above-described slurry between the polishing pad and the material to be polished and polishing at least a part of the material to be polished.

Second and third embodiments of the polishing methods of the present invention relate to polishing methods using the above-described polishing-liquid set. According to these polishing methods, problems such as aggregation of the abrasive grains and a change in polishing properties, which are concerned in the case of storing for a long time after mixing the additive, can be avoided.

Specifically, the polishing method of the second embodiment comprises a step of arranging a material to be polished of a base having the material to be polished on its surface so as to be opposed to a polishing pad, a step of obtaining the polishing liquid by mixing the first liquid and the second liquid of the above-described polishing-liquid set, and a step of supplying the polishing liquid between the polishing pad and the material to be polished and polishing at least a part of the material to be polished. The polishing method of the third embodiment comprises a step of arranging a material to be polished of a base having the material to be polished on its surface so as to be opposed to a polishing pad, and a step of supplying each of the first liquid and the second liquid of the above-described polishing-liquid set between the polishing pad and the material to be polished and polishing at least a part of the material to be polished.

A fourth embodiment of the polishing methods of the present invention relates to a polishing method using the above-described polishing liquid. Specifically, the polishing method of the fourth embodiment comprises a step of arranging a material to be polished of a base having the material to be polished on its surface so as to be opposed to a polishing pad, and a step of supplying the above-described polishing liquid between the polishing pad and the material to be polished and polishing at least a part of the material to be polished.

The material to be polished preferably includes silicon oxide. Moreover, the surface of the material to be polished preferably has irregularities. According to these polishing methods, features of the above-described slurry, polishing-liquid set and polishing liquid can be sufficiently exploited.

The base of the present invention is polished by the above-described polishing methods.

Advantageous Effects of Invention

According to the slurry of the present invention, excellent stability of the abrasive grains can be obtained and a material to be polished can be polished at an excellent polishing rate. According to the polishing-liquid set and the polishing liquid of the present invention, excellent stability of the abrasive grains can be obtained and a material to be polished can be polished at an excellent polishing rate while maintaining an addition effect of an additive. According to the polishing methods of the present invention, the methods excel in throughput because of capable of polishing a material to be polished at an excellent polishing rate, and can satisfy desired properties (for example, flatness, selectivity) in the case of using an additive. The present invention can obtain a particularly excellent polishing rate of an insulating material (for example, an insulating material including silicon oxide), and thus, is particularly suitable for use in polishing a base having an insulating material.

Furthermore, according to the present invention, applications of the above-described slurry, polishing-liquid set and polishing liquid for polishing an insulating material (for example, an insulating material including silicon oxide) are provided. Moreover, according to the present invention, applications of the above-described slurry, polishing-liquid set and polishing liquid to a flattening step of a surface of a base in manufacturing steps of semiconductor elements are provided. In particular, according to the present invention, applications of the above-described slurry, polishing-liquid set and polishing liquid to a flattening step of shallow trench isolation insulating materials, pre-metal insulating materials, interlayer insulating materials or the like are provided.

DESCRIPTION OF EMBODIMENTS

Figure 1:
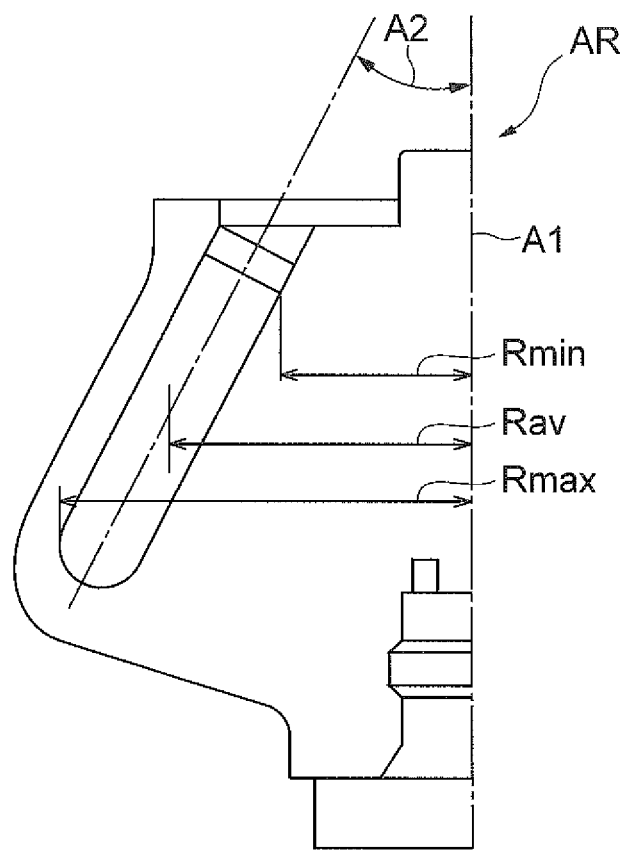
FIG. 1 is a schematic cross-sectional view of an example of an angle rotor.

Hereinafter, embodiments of the present invention will be described in detail. It is to be noted that the present invention is not limited to the following embodiments and may be embodied in various ways within the scope of the present invention. Moreover, in the present description, a "slurry" and a "polishing liquid" are compositions which contact a material to be polished during polishing. Moreover, an "aqueous dispersion" having a content of the abrasive grains adjusted to a predetermined amount means a liquid comprising a predetermined amount of the abrasive grains and water.

In the present embodiment, abrasive grains including a hydroxide of a tetravalent metal element and a compound having an aromatic heterocycle are used together; the aromatic heterocycle has an endocyclic nitrogen atom not bound to a hydrogen atom; and a charge (MK charge) of the endocyclic nitrogen atom obtained by using the Merz-Kollman method (MK method) is −0.45 or less, and therefore, excellent stability of the abrasive grains is obtained, and a material to be polished can be polished at an excellent polishing rate.

The reason why the above-described effect is obtained is not necessarily clear, but the present inventors conjecture as follows. In the case where the aromatic heterocycle has an endocyclic nitrogen atom not bound to a hydrogen atom and the MK charge of the endocyclic nitrogen atom is −0.45 or less, the electron densities of the unshared electron pair and π electron pair of the endocyclic nitrogen atom in the compound having an aromatic heterocycle are thought to be high. For this reason, a coordinate bond is thought to be formed between the endocyclic nitrogen atom and the tetravalent metal element (for example, cerium) to make it easier to form a complex. As a result, it is conjectured that the compound having an aromatic heterocycle is bound to the tetravalent metal element in the abrasive grains, and ions which are easily emitted with time are previously desorbed, which improves stability of the abrasive grains and stability of polishing properties such as a polishing rate <Polishing Liquid>

The polishing liquid of the present embodiment comprises abrasive grains, a compound having an aromatic heterocycle, an additive (excluding the compound having an aromatic heterocycle), and water. Hereinafter, each of the constituent components of the polishing liquid will be described.

(Abrasive Grains)

The polishing liquid of the present embodiment comprises abrasive grains including a hydroxide of a tetravalent metal element. The "hydroxide of a tetravalent metal element" is a compound including a tetravalent metal ion ($M^{4+}$) and at least one hydroxide ion (OH). The hydroxide of a tetravalent metal element may include an anion other than the hydroxide ion (for example, nitrate ion $NO_3^-$, sulfate ion $SO_4^{2-}$). For example, the hydroxide of a tetravalent metal element may include an anion (for example, nitrate ion, sulfate ion) bonded to the tetravalent metal element.

The tetravalent metal element is preferably rare earth elements. Examples of rare earth elements which can be tetravalent include lanthanoids such as cerium, praseodymium and terbium, from the viewpoint of easy availability and further excelling in a polishing rate, cerium is further preferable. Two or more kinds may be selected from rare earth elements to be used.

The polishing liquid of the present embodiment may further comprise other types of abrasive grains, within a range not impairing the properties of the abrasive grains including the hydroxide of a tetravalent metal element. Specifically, abrasive grains including silica, alumina, zirconia, a resin or the like, for example, may be used.

The lower limit of the content of the hydroxide of a tetravalent metal element in the abrasive grains is preferably 50 mass % or more, more preferably 60 mass % or more, further preferably 70 mass % or more, particularly preferably 80 mass % or more, and extremely preferably 90 mass % or more, based on the total mass of the abrasive grains. The abrasive grains are preferably made of the hydroxide of a tetravalent metal element (substantial 100 mass % of the abrasive grains is particles of the hydroxide of a tetravalent metal element) from the viewpoint of making it easier to prepare a polishing liquid and further excelling in polishing properties, and the abrasive grains are more preferably made of the hydroxide of tetravalent cerium (substantial 100 mass % of the abrasive grains is particles of the hydroxide of tetravalent cerium) from the viewpoint of high chemical activity and further excelling in a polishing rate.

In the constituent components of the polishing liquid of the present embodiment, the hydroxide of a tetravalent metal element is thought to have a significant impact on polishing properties. Thus, by adjusting the content of the hydroxide of a tetravalent metal element, a chemical interaction between the abrasive grains and a surface to be polished is improved, and the polishing rate can be further improved. Specifically, the lower limit of the content of the hydroxide of a tetravalent metal element is preferably 0.01 mass % or more, more preferably 0.03 mass % or more, and further preferably 0.05 mass % or more, based on the total mass of the polishing liquid, from the viewpoint of making it easier to sufficiently exhibit the function of the hydroxide of a tetravalent metal element. The upper limit of the content of the hydroxide of a tetravalent metal element is preferably 8 mass % or less, more preferably 5 mass % or less, further preferably 3 mass % or less, particularly preferably 1 mass % or less, extremely preferably 0.5 mass % or less, and very preferably 0.3 mass % or less, based on the total mass of the polishing liquid, from the viewpoint of making it easier to avoid aggregation of the abrasive grains, and from the viewpoint of obtaining a favorable chemical interaction with the surface to be polished, and capable of effectively using properties of the abrasive grains.

In the polishing liquid of the present embodiment, the lower limit of the content of the abrasive grains is preferably 0.01 mass % or more, more preferably 0.03 mass % or more, and further preferably 0.05 mass % or more, based on the total mass of the polishing liquid from the viewpoint of making it easier to obtain a desired polishing rate. The upper limit of the content of the abrasive grains is not particularly limited, but from the viewpoint of making it easier to avoid aggregation of the abrasive grains and allowing the abrasive grains to effectively act on the surface to be polished to smoothly promote polishing, it is preferably 10 mass % or less, more preferably 5 mass % or less, further preferably 3 mass % or less, particularly preferably 1 mass % or less, extremely preferably 0.5 mass % or less, and very preferably 0.3 mass % or less, based on the total mass of the polishing liquid.

In the case where the average secondary particle diameter (hereinafter referred to as "average particle diameter" unless otherwise noted) of the abrasive grains is to some extent small, the specific surface area of the abrasive grains which contact the surface to be polished is increased and thus, the polishing rate can be further improved, and the mechanical action is suppressed and thus, polishing scratches can be further reduced. Therefore, the upper limit of the average particle diameter is preferably 200 nm or less, more preferably 150 nm or less, further preferably 100 nm or less, particularly preferably 80 nm or less, extremely preferably 60 nm or less, and very preferably 40 nm or less, from the viewpoint of obtaining a further excellent polishing rate and further reducing polishing scratches. The lower limit of the average particle diameter is preferably 1 nm or more, more preferably 2 nm or more, and further preferably 3 nm or more, from the viewpoint of obtaining a further excellent polishing rate and further reducing polishing scratches.

The average particle diameter of the abrasive grains can be measured by the photon correlation method. Specifically, the average particle diameter can be measured using, for example, device name: Zetasizer 3000HS manufactured by Malvern Instruments Ltd., and device name: N5 manufactured by Beckman Coulter, Inc., or the like. Specifically, in a measuring method using N5, for example, an aqueous dispersion having a content of the abrasive grains adjusted to 0.2 mass % is prepared, approximately 4 mL (L represents "liter", the same shall apply hereafter) of this aqueous dispersion is poured into a 1-cm square cell, and the cell is placed in the device. A value obtained by performing measurement at 25° C. with a refractive index and a viscosity of a dispersion medium adjusted to 133 and 0.887 mPa·s can be used as the average particle diameter of the abrasive grains.

[Content of a Non-volatile Component]

The abrasive grains are believed to include large particles having particle sizes which can be measured with a particle size distribution meter, and fine particles having particle sizes which cannot be measured with a particle size distribution meter. In the case where an aqueous dispersion comprising such abrasive grains dispersed in water has been centrifuged by the action of sufficient centrifugal force, the aqueous dispersion is believed to undergo mainly solid-liquid separation into the precipitate (solid phase) and the supernatant liquid (liquid phase), with the large particles settling as the precipitate and the fine particles floating up into the supernatant liquid.

The present inventors have found that a material to be polished can be polished at further excellent polishing rates, by using abrasive grains which produce a supernatant liquid having a high content of a non-volatile component when an aqueous dispersion containing a sufficient amount of the abrasive grains has been centrifuged under specific conditions (conditions that allow action of centrifugal force which can adequately separate the large particles and fine particles). Specifically, the abrasive grains of the present embodiment preferably produce a supernatant liquid having a content of a non-volatile component of 500 ppm or more when an aqueous dispersion having a content of the abrasive grains adjusted to 1.0 mass % has been centrifuged for 50 minutes at a centrifugal acceleration of $1.59 \times 10^5$ G.

The present inventors conjecture the following as the reason for which an effect of improving polishing rate is obtained in the case where the content of a non-volatile component contained in the centrifuged supernatant liquid is high. In the case where the slurry and polishing liquid comprising the abrasive grains are centrifuged for 50 minutes at a centrifugal acceleration of $1.59 \times 10^5$ G, generally, almost all abrasive grains settle. However, since the particle diameter is sufficiently small in the present embodiment, many fine particles, which do not settle even if centrifuge separation is performed under the above-described conditions, are included. Specifically, it is thought that, the proportion of fine particles in the abrasive grains is increased as the content of a non-volatile component is increased, and the surface area of the abrasive grains contacting with the surface to be polished is enlarged. It is thought that this promotes polishing by chemical action, and improves the polishing rate.

The lower limit of the content of a non-volatile component of the supernatant liquid is preferably 500 ppm or more, more preferably 700 ppm or more, and further preferably 800 ppm or more, from the viewpoint of obtaining a further excellent polishing rate. The upper limit of the content of a non-volatile component of the supernatant liquid is 10000 ppm, for example.

The apparatus used for the centrifugal separation may be an angle rotor having a tube positioned at a prescribed angle, and a swing rotor having a variable tube angle, with the tube positioned horizontally or nearly horizontally during the centrifugal separation.

FIG. 1 is a schematic cross-sectional view of an example of an angle rotor. The angle rotor AR has bilateral symmetry around a rotation axis A1 as the center, and only one side (the left side of the figure) is shown while the other side (the right side of the figure) is omitted in FIG. 1. In FIG. 1, A2 is the tube angle, $R_{min}$ is the minimum radius from the rotation axis A1 to the tube, and $R_{max}$ is the maximum radius from the rotation axis A1 to the tube. $R_{av}$ is the average radius from the rotation axis A1 to the tube, and is calculated as "$(R_{min}+R_{max})/2$".

For this type of centrifugal separation apparatus, the centrifugal acceleration [units: G] can be calculated by the following formula (1).

$$\text{Centrifugal acceleration } [G] = 1118 \times R \times N^2 \times 10^{-8} \tag{1}$$

[In the formula, R represents the radius of rotation (cm), and N represents the rotational speed per minute (rpm=$\text{min}^{-1}$).]

In the present embodiment, centrifugal separation is carried out with the rotational speed N set for a centrifugal acceleration of $1.59 \times 10^5$ G using the value of the average radius $R_{av}$ in FIG. 1 as the radius of rotation R in formula (1). In the case where a swing rotor is used instead of the angle rotor as shown in FIG. 1, the minimum radius $R_{min}$, maximum radius $R_{max}$, and average radius $R_{av}$ are each calculated from the state of the tube in the centrifugal separation, to set the conditions.

The abrasive grains can be separated into large particles and fine particles using an ultracentrifuge 70P-72 manufactured by Hitachi Koki Co., Ltd., for example, as the angle rotor. Specifically, centrifugal separation of the aqueous dispersion using the 70P-72 can be carried out in the following manner, for example. First, an aqueous dispersion having a content of the abrasive grains adjusted to 1.0 mass % is prepared, and after filling it into a centrifuge tube, the centrifuge tube is placed in a rotor. After rotating for 50 minutes at a rotational speed of 50000 $\text{min}^{-1}$, the centrifuge tube is removed from the rotor and the supernatant liquid in the centrifuge tube is collected. The content of a non-volatile component of the supernatant liquid can be calculated by measuring the mass of the collected supernatant liquid and the mass of the residue after drying the supernatant liquid.

[Light Transmittance]

The polishing liquid of the present embodiment preferably has high transparency for visible light (it is visually transparent or nearly transparent). Specifically, the abrasive grains comprised in the polishing liquid of the present embodiment preferably produce light transmittance of 50%/cm or more for light having a wavelength of 500 nm in an aqueous dispersion having a content of the abrasive grains adjusted to 1.0 mass %. Therefore, since a reduction in polishing rate by addition of additives can be further suppressed, it becomes easier to obtain other properties while maintaining a polishing rate. From the same viewpoint, the lower limit of the light transmittance is more preferably 60%/cm or more, further preferably 70%/cm or more, particularly preferably 80%/cm or more, extremely preferably 90%/cm or more, very preferably 95%/cm or more, still more preferably 98%/cm or more, and still further preferably 99%/cm or more. The upper limit of the light transmittance is 100%/cm.

The reason why the reduction in the polishing rate can be suppressed by adjusting the light transmittance of the abrasive grains in this manner is not understood in detail, but the present inventors conjecture as follows. The action of the abrasive grains including the hydroxide of a tetravalent metal element (such as cerium) as abrasive grains is thought to more dominantly depend on the chemical action than on the mechanical action. Therefore, the number of the abrasive grains is thought to contribute to the polishing rate more than the size of the abrasive grains.

In the case where the light transmittance is low in an aqueous dispersion having a content of the abrasive grains adjusted to 1.0 mass %, it is thought that, in the abrasive grains present in the aqueous dispersion, particles having a large particle diameter (hereinafter referred to as "coarse particles") exist in relatively large numbers. When an additive (for example, polyvinyl alcohol (PVA)) is added to a polishing liquid comprising such abrasive grains, other particles aggregate around the coarse particles as nuclei. It is thought that, as a result, the number of the abrasive grains which act on a surface to be polished per unit area (effective abrasive grain number) is reduced and the specific surface area of the abrasive grains which contact the surface to be polished is reduced, and thus, the polishing rate is reduced.

On the other hand, in the case where the light transmittance is high in an aqueous dispersion having a content of the abrasive grains adjusted to 1.0 mass %, it is thought that the abrasive grains present in this aqueous dispersion are in a state where the above-described "coarse particles" are small in number. In the case where the abundance of the coarse particles is low in this manner, even when an additive (for example, polyvinyl alcohol) is added to a polishing liquid, since the coarse particles which are to be nuclei for aggregation are small in number, aggregation between abrasive grains is suppressed or the size of aggregated particles is relatively small. It is thought that, as a result, the number of the abrasive grains which act on a surface to be polished per unit area (effective abrasive grain number) is maintained and the specific surface area of the abrasive grains which contact the surface to be polished is maintained, and thus, the reduction in the polishing rate becomes difficult to occur.

According to the study by the present inventors, it was found that, even among polishing liquids in which particle diameters of the abrasive grains measured by a common particle diameter measuring device are the same, some may be visually transparent (high light transmittance) and some may be visually turbid (low light transmittance). Thereby, it is thought that the coarse particles which can produce the action described above contribute to the reduction in the polishing rate even by a very slight amount which cannot be detected by a common particle diameter measuring device.

The above-described light transmittance is transmittance for light having a wavelength of 500 nm. The above-described light transmittance is measured by a spectrophotometer, and specifically, is measured by a spectrophotometer U3310 (device name) manufactured by Hitachi, Ltd., for example.

As a more specific measuring method, an aqueous dispersion having a content of the abrasive grains adjusted to 1.0 mass % is prepared as a measuring sample. Approximately 4 mL of this measuring sample is poured into a 1-cm square cell, and the cell is placed in the device and measurement is performed. In the case where the light transmittance is 50%/cm or more in an aqueous dispersion having a content of the abrasive grains of more than 1.0 mass %, it is clear that the light transmittance is also 50%/cm or more in the case where it is diluted to 1.0 mass %. Therefore, the light transmittance can be screened by a simple method by using an aqueous dispersion having a content of the abrasive grains of more than 1.0 mass %.

[Absorbance]

When the abrasive grains including the hydroxide of a tetravalent metal element produce absorbance of 1.00 or more for light having a wavelength of 400 nm in an aqueous dispersion having a content of the abrasive grains adjusted to 1.0 mass %, the polishing rate can be further improved. The reason for this is not necessarily clear, but the present inventors conjecture as follows. Specifically, it is thought that, depending on manufacturing conditions of the hydroxide of a tetravalent metal element and the like, for example, particles including $M(OH)_a X_b$ composed of a tetravalent metal ion ($M^{4+}$), 1 to 3 hydroxide ions ($OH^-$), and 1 to 3 anions ($X^{c-}$) (in the formula, $a+b \times c=4$) are generated as a part of the abrasive grains (it is to be noted that the foregoing particles are also "the abrasive grains including the hydroxide of a tetravalent metal element"). It is thought that, in $M(OH)_a X_b$, the electron-withdrawing anions ($X^{c-}$) act to improve the reactivity of the hydroxide ions and the polishing rate is improved as the abundance of $M(OH)_a X_b$ is increased. In addition, it is thought that, since the particles including $M(OH)_a X_b$ absorb light having a wavelength of 400 nm, as the abundance of $M(OH)_a X_b$ is increased and the absorbance for light having a wavelength of 400 nm is increased, the polishing rate is improved. The abrasive grains including the hydroxide of a tetravalent metal element may be a dinuclear such as $M_d(OH)_a X_b$ (wherein $a+b \times c=4d$), for example.

It is thought that the abrasive grains including the hydroxide of a tetravalent metal element can include not only $M(OH)_a X_b$ but also $M(OH)_4$, $MO_2$ and the like. Examples of the anions ($X^{c-}$) include $NO_3^-$, $SO_4^{2-}$ and the like.

It is to be noted that the inclusion of $M(OH)_a X_b$ in the abrasive grains can be confirmed, after washing the abrasive grains with pure water well, by a method for detecting a peak corresponding to the anions ($X^{c-}$) by using the FT-IR ATR method (Fourier transform Infra-Red Spectrometer Attenuated Total Reflection Method). The existence of the anions ($X^{c-}$) can also be confirmed by the XPS method (X-ray Photoelectron Spectroscopy).

The absorption peak of $M(OH)_a X_b$ (for example, $M(OH)_3 X$) at a wavelength of 400 nm has been confirmed to be much smaller than the absorption peak at a wavelength of 290 nm described below. In this regard, the present inventors studied the magnitude of absorbance using an aqueous dispersion having an abrasive grain content of 1.0 mass %, which has a relatively high content of the abrasive grains and whose absorbance is easily detected to a greater degree, and as a result, found that an effect of improving polishing rate is excellent in the case of using abrasive grains which produce absorbance of 1.00 or more for light having a wavelength of 400 nm in such aqueous dispersion. Since the absorbance for light having a wavelength of 400 nm is thought to be derived from the abrasive grains as described above, a material to be polished cannot be polished at an excellent polishing rate with a polishing liquid comprising a substance which produces absorbance of 1.00 or more for light having a wavelength of 400 nm (for example, a pigment composition which exhibits a yellow color) in place of the abrasive grains which produce absorbance of 1.00 or more for light having a wavelength of 400 nm.

The lower limit of the absorbance for light having a wavelength of 400 nm is preferably 1.00 or more, more preferably 1.20 or more, further preferably 1.40 or more, and particularly preferably 1.45 or more from the viewpoint of obtaining a further excellent polishing rate. The upper limit of the absorbance for light having a wavelength of 400 nm is not particularly limited, but it is preferably 10.0 or less, for example.

When the abrasive grains including the hydroxide of a tetravalent metal element produce absorbance of 1.000 or more for light having a wavelength of 290 nm in an aqueous dispersion having a content of the abrasive grains adjusted to 0.0065 mass %, the polishing rate can be further improved. The reason is not necessarily clear, but the present inventors conjecture as follows. Specifically, particles including $M(OH)_aX_b$ (for example, $M(OH)_3X$) which are generated depending on manufacturing conditions of the hydroxide of a tetravalent metal element and the like have a calculated absorption peak at a wavelength of about 290 nm, for example, particles composed of $Ce^{4+}(OH^-)_3NO_3{}^-$ have an absorption peak at a wavelength of 290 nm. Thus, it is thought that, as the abundance of $M(OH)_aX_b$ is increased and the absorbance for light having a wavelength of 290 nm is increased, the polishing rate is improved.

The absorbance for light having a wavelength of about 290 nm tends to be detected to a greater degree as the measuring limit is exceeded. In this regard, the present inventors studied the magnitude of absorbance using an aqueous dispersion having an abrasive grain content of 0.0065 mass %, which has a relatively low abrasive grain content and whose absorbance is easily detected to a lesser degree, and as a result, found that an effect of improving polishing rate is excellent in the case of using abrasive grains which produce absorbance of 1.000 or more for light having a wavelength of 290 nm in such aqueous dispersion. Moreover, the present inventors found that, apart from light having a wavelength of about 400 nm, which, when being absorbed by a light-absorbing substance, tends to make the light-absorbing substance exhibit a yellow color, as absorbance of abrasive grains for light having a wavelength of about 290 nm becomes high, yellowishness of a polishing liquid and a slurry using such abrasive grains becomes deep, and found that the polishing rate is improved as the yellowishness of the polishing liquid and the slurry becomes deep. The present inventors found that the absorbance for light having a wavelength of 290 nm in an aqueous dispersion having an abrasive grain content of 0.0065 mass % is correlated with the absorbance for light having a wavelength of 400 nm in an aqueous dispersion having an abrasive grain content of 1.0 mass %.

The lower limit of the absorbance for light having a wavelength of 290 nm is preferably 1.000 or more, more preferably 1.050 or more, further preferably 1.100 or more, particularly preferably 1.150 or more, and extremely preferably 1.200 or more from the viewpoint of polishing a material to be polished at a further excellent polishing rate. The upper limit of the absorbance for light having a wavelength of 290 nm is not particularly limited, but it is preferably 10.000 or less, for example.

A material to be polished can be polished at a further excellent polishing rate in the case where the abrasive grains producing absorbance of 1.00 or more for light having a wavelength of 400 nm produce absorbance of 1.000 or more for light having a wavelength of 290 nm in an aqueous dispersion having a content of the abrasive grains adjusted to 0.0065 mass %.

The hydroxide of a tetravalent metal element (for example, $M(OH)_aX_b$) tends not to absorb light having a wavelength of 450 nm or more, and particularly light having a wavelength of 450 to 600 nm. Therefore, from the viewpoint of suppressing adverse impacts on polishing by inclusion of impurities and polishing a material to be polished at a further excellent polishing rate, the abrasive grains preferably produce absorbance of 0.010 or less for light having a wavelength of 450 to 600 nm in an aqueous dispersion having a content of the abrasive grains adjusted to 0.0065 mass % (65 ppm). Specifically, absorbance for all of light within a range of a wavelength of 450 to 600 nm preferably does not exceed 0.010 in the aqueous dispersion having a content of the abrasive grains adjusted to 0.0065 mass %. The lower limit of the absorbance for light having a wavelength of 450 to 600 nm is preferably 0.

The absorbance in an aqueous dispersion can be measured, for example, using a spectrophotometer (device name: U3310) manufactured by Hitachi, Ltd. Specifically, an aqueous dispersion having a content of the abrasive grains adjusted to 1.0 mass % or 0.0065 mass % is prepared as a measuring sample. Approximately 4 mL of this measuring sample is poured into a 1-cm square cell, and the cell is placed in the device. Next, absorbance measurement is performed within a range of a wavelength of 200 to 600 nm, and the absorbance is determined from the obtained chart.

If absorbance of 1.00 or more is exhibited in the case where the absorbance for light having a wavelength of 400 nm is measured by excessively diluting such that the content of the abrasive grains is less than 1.0 mass %, the absorbance may be screened by assuming that the absorbance is 1.00 or more in the case where the content of the abrasive grains is 1.0 mass %. If absorbance of 1.000 or more is exhibited in the case where the absorbance for light having a wavelength of 290 nm is measured by excessively diluting such that the content of the abrasive grains is less than 0.0065 mass %, the absorbance may be screened by assuming that the absorbance is 1.000 or more in the case where the content of the abrasive grains is 0.0065 mass %. If absorbance of 0.010 or less is exhibited in the case where the absorbance for light having a wavelength of 450 to 600 nm is measured by diluting such that the content of the abrasive grains is more than 0.0065 mass %, the absorbance may be screened by assuming that the absorbance is 0.010 or less in the case where the content of the abrasive grains is 0.0065 mass %.

The absorbance and light transmittance which the abrasive grains produce in the aqueous dispersion can be measured by, after removing solid components other than the abrasive grains and liquid components other than water, preparing an aqueous dispersion having a predetermined abrasive grain content and using such aqueous dispersion. For removing the solid components and the liquid components, although varying depending on components comprised in the polishing liquid, centrifugation methods such as centrifugation using a centrifuge capable of applying gravitational acceleration of several thousand G or less and ultracentrifugation using an ultracentrifuge capable of applying gravitational acceleration of several tens of thousands G or more; chromatography methods such as partition chromatography, adsorption chromatography, gel permeation chromatography, and ion-exchange chromatography; filtration methods such as natural filtration, filtration under reduced pressure, pressure filtration, and ultrafiltration; distillation methods such as distillation under reduced pressure and atmospheric distillation, and the like, can be used, or these may be combined as appropriate.

For example, in the case where the polishing liquid comprises a compound having a weight-average molecular weight of several tens of thousands or more (for example, 50000 or more), there are chromatography methods and filtration methods, and gel permeation chromatography and ultrafiltration are preferable. In the case of using filtration methods, the abrasive grains comprised in the polishing liquid can be made to pass through a filter by setting appropriate conditions. In the case where the polishing liquid comprises a compound having a weight-average molecular weight of several tens of thousands or less (for example, less than 50000), there are chromatography methods, filtration methods, and distillation methods, and gel permeation chromatography, ultrafiltration, and distillation under reduced pressure are preferable. In the case where abrasive grains other than the abrasive grains including the hydroxide of a tetravalent metal element is comprised in the polishing liquid, there are filtration methods and centrifugation methods, and much abrasive grains including the hydroxide of a tetravalent metal element are comprised in a filtrate in the case of filtration and in a liquid phase in the case of centrifugation.

As a method for separating the abrasive grains by chromatography methods, for example, the abrasive grain can be fractionated and/or other components can be fractionated by the following conditions.

sample solution: polishing liquid 100 μL
detector: UV-VIS Detector manufactured by Hitachi, Ltd., product name "L-4200", wavelength: 400 nm
integrator: GPC Integrator manufactured by Hitachi, Ltd., product name "D-2500"
pump: manufactured by Hitachi, Ltd., product name "L-7100"
column: packing column for water-based HPLC manufactured by Hitachi Chemical Co., Ltd., product name "GL-W550S"
eluent: deionized water
measurement temperature: 23° C.
flow rate: 1 mL/min (pressure: about 40 to 50 kg/cm$^2$)
measurement time: 60 min It is to be noted that deaeration treatment of an eluent is preferably performed using a deaerator before performing chromatography. In the case where a deaerator cannot be used, an eluent is preferably deaeration-treated in advance with ultrasonic wave or the like.

The abrasive grains may not be able to be fractionated under the above-described conditions depending on components comprised in the polishing liquid, and in this case, the abrasive grains can be separated by optimizing the amount of a sample solution, the kind of a column, the kind of an eluent, a measurement temperature, a flow rate and the like. Moreover, by adjusting the pH of the polishing liquid, distillation time of the components comprised in the polishing liquid is adjusted, and it may be separated from the abrasive grains. In the case where the polishing liquid comprises insoluble components, the insoluble components are preferably removed by filtration, centrifugation or the like, as necessary.

[Manufacturing Method of Abrasive Grains]

It is preferable that the hydroxide of a tetravalent metal element is obtained by reacting a salt of a tetravalent metal element (metal salt) with an alkali source (base). This makes it possible to obtain particles having an extremely fine particle diameter, which can provide a further improvement in an effect of reducing polishing scratches. The hydroxide of a tetravalent metal element can be obtained by mixing a salt of a tetravalent metal element with an alkali liquid (for example, alkali aqueous solution). Moreover, the hydroxide of a tetravalent metal element can be obtained by mixing a metal salt solution including a salt of a tetravalent metal element (for example, metal salt aqueous solution) with an alkali liquid. As the salt of a tetravalent metal element, $M(NO_3)_4$, $M(SO_4)_2$, $M(NH_4)_2(NO_3)_6$, $M(NH_4)_4(SO_4)_4$ and the like, in which a metal is indicated as M, are included.

It is to be noted that, in the case where at least one of the salt of a tetravalent metal element and the alkali source is supplied to a reaction system in a liquid state, a means for stirring a mixed liquid is not limited, and examples thereof include a method of stirring the mixed liquid using a rod-like, plate-like or propeller-like stirrer, or stirring blade, which rotates around a rotation axis; a method of stirring the mixed liquid by rotating a stirrer with a rotating magnetic field using a magnetic stirrer which transmits power from the outside of a container; a method of stirring the mixed liquid with a pump placed on the outside of a tank; and a method of stirring the mixed liquid by pressurizing outside air and furiously blowing it into a tank.

Examples of a means for adjusting the content of a non-volatile component of the supernatant liquid, the light transmittance and the absorbance include optimization of the manufacturing method of the hydroxide of a tetravalent metal element. Examples of the means for adjusting the content of a non-volatile component of the supernatant liquid include adjustment of the raw material concentrations in the metal salt solution and the alkali liquid, adjustment of the mixing rate of the metal salt solution and the alkali liquid, adjustment of the stirring rate when mixing, and adjustment of the liquid temperature of the mixed liquid. Examples of the means for adjusting the light transmittance for light having a wavelength of 500 nm include adjustment of the raw material concentrations in the metal salt solution and the alkali liquid, adjustment of the mixing rate of the metal salt solution and the alkali liquid, adjustment of the stirring rate when mixing, and adjustment of the liquid temperature of the mixed liquid. Examples of the means for adjusting the absorbance for light having a wavelength of 400 nm and the absorbance for light having a wavelength of 290 nm include adjustment of the raw material concentrations in the metal salt solution and the alkali liquid, adjustment of the mixing rate of the metal salt solution and the alkali liquid, and adjustment of the liquid temperature of the mixed liquid.

The content of a non-volatile component of the supernatant liquid tends to be increased by increasing the metal salt concentration of the metal salt solution, and the content of a non-volatile component of the supernatant liquid tends to be increased by decreasing the alkali concentration of the alkali liquid. The light transmittance tends to be increased by increasing the metal salt concentration, and the light transmittance tends to be increased by decreasing the alkali concentration. The absorbance tends to be increased by increasing the metal salt concentration of the metal salt solution, and the absorbance tends to be increased by decreasing the alkali concentration of the alkali liquid.

The content of a non-volatile component of the supernatant liquid tends to be increased by slowing the mixing rate, and the content of a non-volatile component of the supernatant liquid tends to be decreased by quickening the mixing rate. The light transmittance tends to be increased by slowing the mixing rate, and the light transmittance tends to be decreased by quickening the mixing rate. The absorbance tends to be increased by slowing the mixing rate, and the absorbance tends to be decreased by quickening the mixing rate.

The content of a non-volatile component of the supernatant liquid tends to be increased by quickening the stirring rate, and the content of a non-volatile component of the supernatant liquid tends to be decreased by slowing the stirring rate. The light transmittance tends to be increased by quickening the stirring rate, and the light transmittance tends to be decreased by slowing the stirring rate.

The content of a non-volatile component of the supernatant liquid tends to be increased by lowering the liquid temperature, and the content of a non-volatile component of the supernatant liquid tends to be decreased by raising the liquid temperature. The light transmittance tends to be increased by lowering the liquid temperature, and the light transmittance tends to be decreased by raising the liquid temperature. The absorbance tends to be increased by lowering the liquid temperature, and the absorbance tends to be decreased by raising the liquid temperature.

There is a case where the hydroxide of a tetravalent metal element prepared as described above includes impurities, and the impurities may be removed. A method for removing the impurities is not particularly limited, and examples thereof include methods such as centrifugation, filter press, and ultrafiltration. This makes it possible to adjust the absorbance for light having a wavelength of 450 to 600 nm.

Method for producing the abrasive grains including the hydroxide of a tetravalent metal element are described in detail in Patent Literatures 2 to 4, and the descriptions thereof are incorporated by reference herein.

(Compound Having Aromatic Heterocycle)

The polishing liquid of the present embodiment comprises a compound having an aromatic heterocycle (hereinafter, referred to as an "aromatic heterocyclic compound"). The aromatic heterocycle of the aromatic heterocyclic compound is a nitrogen-containing aromatic heterocyclic compound having at least one endocyclic nitrogen atom (a nitrogen atom constituting the aromatic heterocycle) not bound to a hydrogen atom. The endocyclic nitrogen atom not bound to a hydrogen atom has a predetermined MK charge obtained by using the MK method, and the MK charge of the endocyclic nitrogen atom is −0.45 or less from the viewpoint of obtaining excellent stability of the abrasive grains.

The MK charge refers to an index representing the deviation of a charge of each atom in a molecule. The MK charge can be calculated by the Merz-Kollman method (MK method) for performing structural optimization using Gaussian 09 (registered trademark manufactured by Gaussian) and a base function B3LYP/6-31G (d), for example.

From the viewpoint of obtaining further excellent stability of the abrasive grains, the upper limit of the MK charge of the endocyclic nitrogen atom is preferably −0.50 or less, more preferably −0.52 or less, and further preferably −0.55 or less. The lower limit of the MK charge of the endocyclic nitrogen atom is not particularly limited, but it is −1.00, for example. In the case where the valence of the compound is zero, it is difficult to think that the lower limit of the MK charge is less than −1.00.

Examples of the aromatic heterocyclic compound having an endocyclic nitrogen atom of which the MK charge is −0.45 or less include azoles, pyridines, pyrazines, and triazines. Examples of the azoles include imidazole, 2-aminoimidazole, 2-methylimidazole, 1,2-dimethylimidazole, imidazole-4,5-dicarboxylic acid, benzimidazole, 2-aminobenzimidazole, 2-hydroxybenzimidazole, 1,2,4-triazole, 3-amino-1,2,4-triazole, 3,5-diamino-1,2,4-triazole, 3-amino-5-mercapto-1,2,4-triazole, 3-amino-5-methylmercapto-1,2,4-triazole, 3-amino-1,2,4-triazole-5-carboxylic acid, 3-aminopyrazole-4-carboxylic acid ethyl, 3-methylpyrazole, 3,5-dimethylpyrazole, 2-hydroxybenzimidazole, and 4,5-dimethylthiazole. Examples of the pyridines include pyridine, 2-aminopyridine, 3-aminopyridine, 4-aminopyridine, 2-methylpyridine, 2-cyanopyridine, 2-acetylpyridine, 2-acetoamidepyridine, 6-amino-2-picoline, picolinic acid, 6-hydroxy-2-picolinic acid, pyridine-2,6-dicarboxylic acid (alias: 2,6-dipicolinic acid), and nicotinamide. Examples of the pyrazines include 2-aminopyrazine, pyrazine carboxylic acid, 3-aminopyrazine-2-carboxylic acid, 2-methylpyrazine, 2,3-dimethylpyrazine, 2,5-dimethylpyrazine, 2,6-dimethylpyrazine, and 2-ethylpyrazine. Examples of the triazines include 2,4,6-triamino-1,3,5-triazine. These can be used singly or in combinations of two or more.

Among them, the azoles, the pyridines, and the pyrazines are preferable; imidazole, 2-methylimidazole, 1,2-dimethylimidazole, imidazole-4,5-dicarboxylic acid, benzimidazole, 2-aminobenzimidazole, 2-hydroxybenzimidazole, 1,2,4-triazole, 3-amino-1,2,4-triazole, 3-amino-5-mercapto-1,2,4-triazole, 3-amino-1,2,4-triazole-5-carboxylic acid, 3,5-dimethylpyrazole, 2-hydroxybenzimidazole, 4,5-dimethylthiazole, pyridine, 2-aminopyridine, 3-aminopyridine, 4-aminopyridine, 2-methylpyridine, 2-cyanopyridine, 6-amino-2-picoline, picolinic acid, 6-hydroxy-2-picolinic acid, pyridine-2,6-dicarboxylic acid, 2-aminopyrazine, pyrazine carboxylic acid, and 3-aminopyrazine-2-carboxylic acid are more preferable; and imidazole, 1,2-dimethylimidazole, 2-methylimidazole, benzimidazole, 1,2,4-triazole, 3-amino-1,2,4-triazole, imidazole-4,5-dicarboxylic acid, 3-amino-1,2,4-triazole-5-carboxylic acid, 3-amino-5-mercapto-1,2,4-triazole, 3,5-dimethylpyrazole, pyridine, 2-aminopyridine, 3-aminopyridine, 2-methylpyridine, pyridine-2,6-dicarboxylic acid, 2-aminopyrazine, 3-aminopyrazine-2-carboxylic acid, and pyrazine carboxylic acid are further preferable.

From the viewpoint of obtaining further excellent stability of the abrasive grains, the lower limit of the content of the aromatic heterocyclic compound having an endocyclic nitrogen atom of which the MK charge is −0.45 or less is preferably 0.01 mmol/L or more, more preferably 0.03 mmol/L or more, further preferably 0.05 mmol/L or more, particularly preferably 0.1 mmol/L or more, and extremely preferably 0.2 mmol/L or more, based on the total mass of the polishing liquid. From the viewpoint of improving dispersibility of the abrasive grains, the upper limit of the content of the aromatic heterocyclic compound is preferably 100 mmol/L or less, more preferably 50 mmol/L or less, further preferably 20 mmol/L or less, particularly preferably 10 mmol/L or less, extremely preferably 5 mmol/L or less, and very preferably 2 mmol/L or less, based on the total mass of the polishing liquid.

When the polishing liquid of the present embodiment comprises the aromatic heterocyclic compound having an endocyclic nitrogen atom of which the MK charge is −0.45 or less, the amount of change over time in conductivity can be reduced, and this provides easy process management. From this viewpoint, the upper limit of the amount of the change over time in conductivity is preferably 25 mS/m or less, more preferably 20 mS/m or less, further preferably 18 mS/m or less, and particularly preferably 15 mS/m or less. The lower limit of the amount of the change over time in conductivity is preferably 0 mS/m or more, but it may be −10 mS/m or more on a practical level. The amount of the change over time represents a measured value (B-A) of a difference between conductivity A obtained by measuring the polishing liquid adjusted to 25° C. and conductivity B measured after heating such polishing liquid at 60° C. for 72 hours.

(Additive)

The polishing liquid of the present embodiment comprises an additive. Herein, the "additive" refers to a substance, which is comprised in the polishing liquid, other than a fluid medium such as water, abrasive grains, and an aromatic heterocyclic compound. In the polishing liquid of the present embodiment, by selecting an additive as appropriate, both a polishing rate and polishing properties other than the polishing rate can be achieved at a high level.

As the additive, for example, known additives, such as a dispersing agent which increases dispersibility of the abrasive grains, a polishing rate improver which improves the polishing rate, a flattening agent (a flattening agent which reduces irregularities on a polished surface after polishing, a global flattening agent which improves global flatness of a base after polishing), and a selection ratio improver which improves a polishing selection ratio of an insulating material with respect to a stopper material such as silicon nitride or polysilicon, can be used without particular limitation.

Examples of the dispersing agent include vinyl alcohol polymers and derivatives thereof, betaine, lauryl betaine, and lauryl dimethylamine oxide. Examples of the polishing rate improver include β-alanine betaine and stearyl betaine. Examples of the flattening agent which reduces irregularities on a polished surface include ammonium lauryl sulfate and triethanolamine polyoxyethylene alkyl ether sulfate. Examples of the global flattening agent include polyvinylpyrrolidone and polyacrolein. Examples of the selection ratio improver include polyethyleneimine, polyallylamine, and chitosan. These can be used singly or in combinations of two or more.

From the viewpoint of more effectively obtaining effects of an additive, the lower limit of the content of the additive is preferably 0.01 mass % or more, more preferably 0.1 mass % or more, and further preferably 1.0 mass % or more, based on the total mass of the polishing liquid. From the viewpoint of further suppressing a reduction in the polishing rate of a material to be polished, the upper limit of the content of the additive is preferably 10 mass % or less, more preferably 5.0 mass % or less, and further preferably 3.0 mass % or less, based on the total mass of the polishing liquid.

(Water)

Water in the polishing liquid of the present embodiment is not particularly limited, but deionized water, ultrapure water or the like is preferable. The content of water may be the remainder of the polishing liquid excluding the contents of other constituent components, and is not particularly limited.

(pH of Polishing Liquid)

The pH of the polishing liquid is preferably 2.0 to 9.0 from the viewpoint of obtaining a further excellent polishing rate. It is thought that this is because the surface potential of the abrasive grains with respect to the surface potential of a surface to be polished is favorable, and the abrasive grains are easy to act on the surface to be polished.

From the viewpoint of stabilizing the pH of the polishing liquid and making it difficult for problems such as aggregation of the abrasive grains to occur, the lower limit of the pH is preferably 2.0 or more, more preferably 3.5 or more, further preferably 4.0 or more, particularly preferably 4.5 or more, and extremely preferably 5.0 or more. From the viewpoint of excelling in dispersibility of the abrasive grains and obtaining a further excellent polishing rate, the upper limit of the pH is preferably 9.0 or less, more preferably 8.0 or less, and further preferably 7.5 or less. The pH is defined as a pH at a liquid temperature of 25° C.

The pH of the polishing liquid can be measured with a pH meter (for example, model number PH81 manufactured by Yokogawa Electric Corporation). As the pH, for example, after two-point calibration using a standard buffer (phthalate pH buffer: pH 4.01 (25° C.) and a neutral phosphate pH buffer: pH 6.86 (25° C.)), an electrode is placed in the polishing liquid, and a value stabilized after a lapse of 2 minutes or more is used.

In order to adjust the pH of the polishing liquid, a conventionally-known pH adjuster can be used without particular limitation. Specific examples of the pH adjuster include inorganic acids such as phosphoric acid, sulfuric acid, and nitric acid; organic acids such as carboxylic acids such as formic acid, acetic acid, propionic acid, maleic acid, phthalic acid, citric acid, succinic acid, malonic acid, glutaric acid, adipic acid, fumaric acid, lactic acid, and benzoic acid; amines such as ethylenediamine, toluidine, piperazine, histidine, aniline, picoline acid, morpholine, piperidine, and hydroxylamine; and nitrogen-containing heterocyclic compounds such as 1H-tetrazole, 5-methyl-1H-tetrazole, 1H-1,2,3-triazole, pyrazine, benztriazole, and indazole-3-carboxylic acid. It is to be noted that the pH adjuster may be comprised in a slurry (including slurry precursor, storage liquid for slurry and the like) and an additive liquid described below, and the like.

A pH stabilizer means an additive for adjustment to a predetermined pH, and it is preferably a buffer component. The buffer component is preferably a compound having pKa within a range of ±1.5, and more preferably a compound having pKa within a range of ±1.0, with respect to the predetermined pH. Examples of such a compound include amino acids such as glycine, arginine, lysine, asparagine, aspartic acid, and glutamic acid; mixtures of the above-described carboxylic acids and bases; and salts of the above-described carboxylic acids.

<Slurry>

The slurry of the present embodiment may be used directly for polishing, or may be used as a slurry of a so-called two-pack type polishing liquid, in which the constituent components of the polishing liquid are separated into a slurry and an additive liquid. In the present embodiment, the polishing liquid and the slurry differ in the presence or absence of an additive, and the polishing liquid is obtained by adding the additive to the slurry.

The slurry of the present embodiment comprises at least the same abrasive grains and an aromatic heterocyclic compound as the polishing liquid of the present embodiment, and water. For example, the abrasive grains are characterized by including the hydroxide of a tetravalent metal element, and a preferred range and a measuring method of the average secondary particle diameter of the abrasive grains are the same as the abrasive grains used in the polishing liquid of the present embodiment.

In the slurry of the present embodiment, the abrasive grains preferably produce a liquid phase having a content of a non-volatile component of 500 ppm or more when an aqueous dispersion having a content of the abrasive grains adjusted to 1.0 mass % is centrifuged for 50 minutes at a centrifugal acceleration of $1.59 \times 10^5$ G The abrasive grains preferably produce light transmittance of 50%/cm or more for light having a wavelength of 500 nm in an aqueous dispersion having a content of the abrasive grains adjusted to 1.0 mass %. The abrasive grains preferably produce absorbance of 1.00 or more for light having a wavelength of 400 nm in an aqueous dispersion having a content of the abrasive grains adjusted to 1.0 mass %. The abrasive grains preferably produce absorbance of 1.000 or more for light having a wavelength of 290 nm in an aqueous dispersion having a content of the abrasive grains adjusted to 0.0065 mass %. The abrasive grains preferably produce absorbance of 0.010 or less for light having a wavelength of 450 to 600 nm in an aqueous dispersion having a content of the abrasive grains adjusted to 0.0065 mass %. Preferred ranges and measuring methods of these the content of the non-volatile component, light transmittance, and absorbance are the same as the polishing liquid of the present embodiment.

In the constituent components of the slurry of the present embodiment, the hydroxide of a tetravalent metal element is thought to have a significant impact on polishing properties. Thus, by adjusting the content of the hydroxide of a tetravalent metal element, a chemical interaction between the abrasive grains and a surface to be polished is improved, and the polishing rate can be further improved. Specifically, the lower limit of the content of the hydroxide of a tetravalent metal element is preferably 0.01 mass % or more, more preferably 0.03 mass % or more, and further preferably 0.05 mass % or more, based on the total mass of the slurry, from the viewpoint of making it easier to sufficiently exhibit the function of the hydroxide of a tetravalent metal element. The upper limit of the content of the hydroxide of a tetravalent metal element is preferably 8 mass % or less, more preferably 5 mass % or less, further preferably 3 mass % or less, particularly preferably 1 mass % or less, extremely preferably 0.5 mass % or less, and very preferably 0.3 mass % or less, based on the total mass of the slurry, from the viewpoint of making it easier to avoid aggregation of the abrasive grains, and from the viewpoint of obtaining a favorable chemical interaction with the surface to be polished, and further improving a polishing rate.

In the slurry of the present embodiment, the lower limit of the content of the abrasive grains is preferably 0.01 mass % or more, more preferably 0.03 mass % or more, and further preferably 0.05 mass % or more, based on the total mass of the slurry, from the viewpoint of making it easier to obtain a desired polishing rate. The upper limit of the content of the abrasive grains is not particularly limited, but from the viewpoint of making it easier to avoid aggregation of the abrasive grains and allowing the abrasive grains to effectively act on the surface to be polished to smoothly promote polishing, it is preferably 10 mass % or less, more preferably 5 mass % or less, further preferably 3 mass % or less, particularly preferably 1 mass % or less, extremely preferably 0.5 mass % or less, and very preferably 0.3 mass % or less, based on the total mass of the slurry.

The lower limit of the content of the aromatic heterocyclic compound having an endocyclic nitrogen atom of which the MK charge is −0.45 or less is preferably 0.01 mmol/L or more, more preferably 0.03 mmol/L or more, further preferably 0.05 mmol/L or more, particularly preferably 0.1 mmol/L or more, and extremely preferably 0.2 mmol/L or more, based on the total mass of the slurry, from the viewpoint of obtaining further excellent stability of the abrasive grains. The upper limit of the content of the aromatic heterocyclic compound is preferably 100 mmol/L or less, more preferably 50 mmol/L or less, further preferably 20 mmol/L or less, particularly preferably 10 mmol/L or less, extremely preferably 5 mmol/L or less, and very preferably 2 mmol/L or less, based on the total mass of the slurry, from the viewpoint of improving dispersibility of the abrasive grains.

When the slurry of the present embodiment comprises the aromatic heterocyclic compound having an endocyclic nitrogen atom of which the MK charge is −0.45 or less, the amount of change over time in conductivity can be reduced, and this provides easy process management. From this viewpoint, the upper limit of the amount of the change over time in conductivity is preferably 25 mS/m or less, more preferably 20 mS/m or less, further preferably 18 mS/m or less, and particularly preferably 15 mS/m or less. The lower limit of the amount of the change over time in conductivity is preferably 0 mS/m or more, but it may be −10 mS/m or more on a practical level. The amount of the change over time represents a measured value (B-A) of a difference between conductivity A obtained by measuring the slurry adjusted to 25° C. and conductivity B measured after heating the slurry at 60° C. for 72 hours.

The pH of the slurry of the present embodiment is preferably 2.0 to 9.0 from the viewpoint of obtaining a further excellent polishing rate. It is thought that this is because the surface potential of the abrasive grains with respect to the surface potential of a surface to be polished becomes favorable, and the abrasive grains become easy to act on the surface to be polished. From the viewpoint of stabilizing the pH of the slurry and making it difficult for problems such as aggregation of the abrasive grains to occur, the lower limit of the pH is preferably 2.0 or more, more preferably 2.2 or more, and further preferably 2.5 or more. From the viewpoint of excelling in dispersibility of the abrasive grains and obtaining a further excellent polishing rate, the upper limit of the pH is preferably 9.0 or less, more preferably 8.0 or less, further preferably 7.0 or less, particularly preferably 6.5 or less, and extremely preferably 6.0 or less. It is to be noted that the pH is defined as a pH at a liquid temperature of 25° C. The pH of the slurry can be measured by the same method as the pH of the polishing liquid of the present embodiment.

<Polishing-Liquid Set>

In the polishing-liquid set of the present embodiment, such that a slurry (first liquid) and an additive liquid (second liquid) are mixed to form the polishing liquid, the constituent components of the polishing liquid are separately stored as the slurry and the additive liquid such that the slurry (first liquid) and the additive liquid (second liquid) are mixed to form the polishing liquid. As the slurry, the slurry of the present embodiment can be used. As the additive liquid, a liquid in which the additive is dissolved in water (liquid comprising additive and water) can be used. The polishing-liquid set is used as a polishing liquid by mixing the slurry and the additive liquid when polishing. By separately storing the constituent components of the polishing liquid into at least two liquids in this manner, a polishing liquid which excels in storage stability can be obtained. It is to be noted that, in the polishing-liquid set of the present embodiment, the constituent components may be separated into three liquids or more.

As the additive comprised in the additive liquid, the same additive as one described for the above-described polishing liquid can be used. From the viewpoint of sufficiently suppressing an excessive reduction in the polishing rate when the additive liquid and the slurry are mixed to prepare the polishing liquid, the lower limit of the content of the additive in the additive liquid is preferably 0.01 mass % or more, and more preferably 0.02 mass % or more, based on the total mass of the additive liquid. From the viewpoint of sufficiently suppressing an excessive reduction in the polishing rate when the additive liquid and the slurry are mixed to prepare the polishing liquid, the upper limit of the content of the additive in the additive liquid is preferably 20 mass % or less based on the total mass of the additive liquid.

Water in the additive liquid is not particularly limited, but deionized water, ultrapure water or the like is preferable. The content of water may be the remainder excluding the contents of other constituent components, and is not particularly limited.

<Polishing Method of Base, and Base>

A polishing method of a base using the above-described polishing liquid, slurry or polishing-liquid set, and a base obtained thereby will be described. The polishing method of the present embodiment is a polishing method using a one-pack type polishing liquid in the case of using the above-described polishing liquid or slurry, and is a polishing method using a two-pack type polishing liquid or a three-pack or more type polishing liquid in the case of using the above-described polishing-liquid set.

In the polishing method of a base of the present embodiment, a base having a material to be polished on its surface (for example, substrate such as semiconductor substrate) is polished. In the polishing method of a base of the present embodiment, the material to be polished may be polished using a stopper (a polishing stop layer including a stopper material) formed under the material to be polished. The polishing method of a base of the present embodiment comprises at least a base arranging step and a polishing step. In the base arranging step, a material to be polished of a base having the material to be polished on its surface is arranged so as to be opposed to a polishing pad. In the polishing step, at least a part of the material to be polished is polished and removed by using the polishing liquid, slurry or polishing-liquid set. The shape of the material to be polished, which is subjected to be polished, is not particularly limited, and it is a film shape (material film to be polished), for example.

Examples of the material to be polished include inorganic insulating materials such as silicon oxide; organic insulating materials such as organosilicate glass and a wholly aromatic ring based Low-k material; and stopper materials such as silicon nitride and polysilicon, and among them, insulating materials such as inorganic insulating materials and organic insulating materials are preferable, and inorganic insulating materials are more preferable. A silicon oxide film can be obtained by a low-pressure CVD method, a plasma CVD method or the like. The silicon oxide film may be doped with an element such as phosphorus and boron. The surface of the material to be polished (surface to be polished) preferably has irregularities. In the polishing method of a base of the present embodiment, convex parts of the irregularities of the material to be polished are preferentially polished, and a base having a flattened surface can be obtained.

Figure 2:
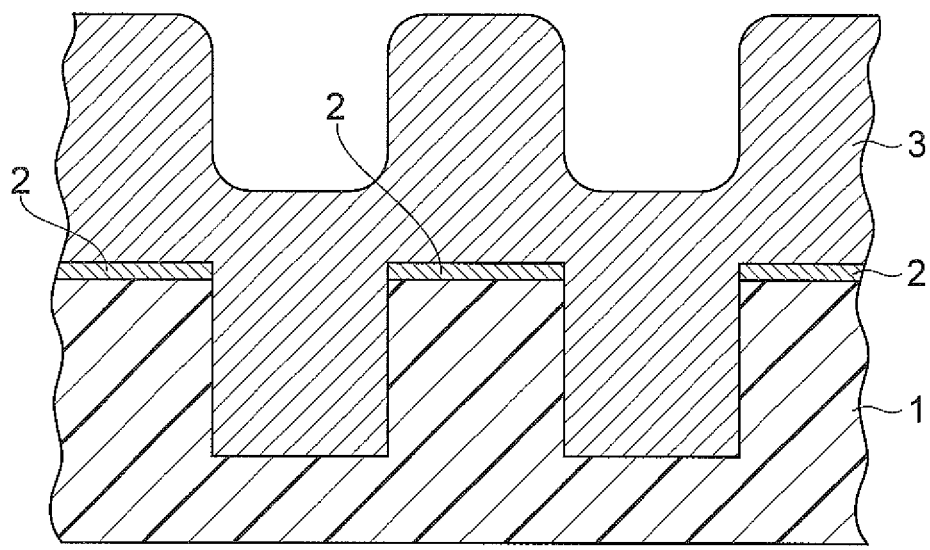
FIG. 2 is a schematic cross-sectional view showing a polishing method of a semiconductor substrate on which an insulating material is formed.
Figure 2:
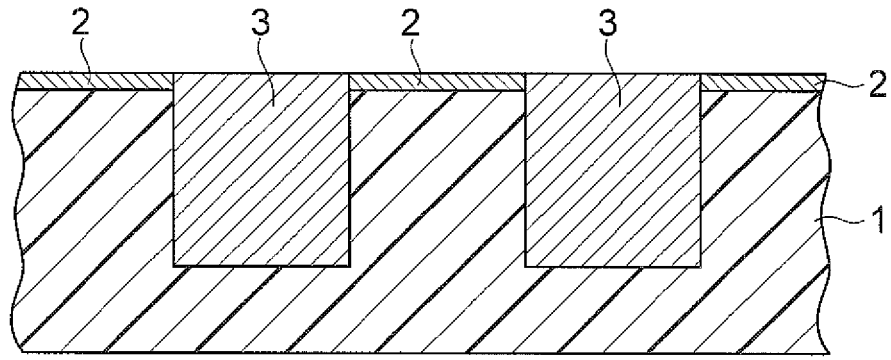

A polishing method will be described in more detail, taking the case where a semiconductor substrate on which an insulating material is formed is used, as an example. First, a substrate is prepared, which has a wafer 1 having a surface on which irregularities having a recessed part and a convex part are formed, a stopper 2 disposed on the convex part of the wafer 1, and an insulating material 3 disposed so that irregularities of the surface of the wafer 1 are buried (FIG. 2(a)). The insulating material 3 is formed on the wafer 1 by the plasma TEOS method or the like. The substrate is polished by using the described-above polishing liquid or the like, to remove the insulating material 3 until the stopper 2 disposed on the convex part of the wafer 1 is exposed (FIG. 2(b)).

In the case where the one-pack type polishing liquid or slurry is used, in the polishing step, the polishing liquid or slurry is supplied between the material to be polished of the base and the polishing pad of a polishing platen, and at least a part of the material to be polished is polished. For example, at least a part of the material to be polished is polished by suppling the polishing liquid or slurry between the polishing pad and the material to be polished and by relatively moving the base and the polishing platen, with the material to be polished pressed against the polishing pad. At this time, the polishing liquid and slurry may be directly supplied onto the polishing pad as a composition having a desired water amount.

From the viewpoint of reducing cost for preservation, transport, storage and the like, the polishing liquid and slurry of the present embodiment can be stored as a storage liquid for a polishing liquid or a storage liquid for a slurry, which is used by diluting liquid components 2-fold or more (based on mass), for example, with a fluid medium such as water. The above-described each storage liquid may be diluted with the fluid medium immediately before polishing, or the storage liquid and the fluid medium are supplied onto the polishing pad and diluted on the polishing pad.

The lower limit of the dilution ratio (based on mass) of the storage liquid is preferably 2-fold or more, more preferably 3-fold or more, further preferably 5-fold or more, and particularly preferably 10-fold or more, because a higher ratio results in a higher reducing effect of cost for preservation, transport, storage and the like. The upper limit of the dilution ratio is not particularly limited, but a higher ratio results in a greater amount (higher concentration) of components comprised in the storage liquid and stability during storage tends to be easily decreased, and thus, it is preferably 500-fold or less, more preferably 200-fold or less, further preferably 100-fold or less, and particularly preferably 50-fold or less. It is to be noted that the same is applied for a polishing liquid in which the constituent components are separated into three liquids or more.

In the above-described storage liquid, the upper limit of the content of the abrasive grains is not particularly limited, but from the viewpoint of making it easier to avoid aggregation of the abrasive grains, it is preferably 20 mass % or less, more preferably 15 mass % or less, further preferably 10 mass % or less, and particularly preferably 5 mass % or less, based on the total mass of the storage liquid. From the viewpoint of reducing cost for preservation, transport, storage and the like, the lower limit of the content of the abrasive grains is preferably 0.02 mass % or more, more preferably 0.1 mass % or more, further preferably 0.5 mass % or more, and particularly preferably 1 mass % or more, based on the total mass of the storage liquid.

In the case where the two-pack type polishing liquid is used, the polishing method of a base of the present embodiment may comprise a polishing liquid preparing step in which the slurry and the additive liquid are mixed before the polishing step to obtain a polishing liquid. In this case, in the polishing step, the material to be polished is polished by using the polishing liquid obtained in the polishing liquid preparing step, and for example, the polishing liquid is supplied between the material to be polished of the base and the polishing pad of a polishing platen, and at least a part of the material to be polished is polished. In the polishing liquid preparing step of the foregoing polishing method, the slurry and the additive liquid are solution-sent through separate pipes, and these pipes are merged just before the exit of a supply pipe to obtain the polishing liquid. The polishing liquid may be directly supplied onto the polishing pad as a polishing liquid having a desired water amount or may be diluted on the polishing pad after being supplied onto the polishing pad as a storage liquid having a small water amount. It is to be noted that the same is applied for a polishing liquid in which the constituent components are separated into three liquids or more.

In the case where the two-pack type polishing liquid is used, in the polishing step, at least a part of the material to be polished may be polished by the polishing liquid obtained by supplying each of the slurry and the additive liquid between the polishing pad and the material to be polished and mixing the slurry and the additive liquid. In the foregoing polishing method, the slurry and the additive liquid can be supplied onto the polishing pad through separate solution-sending systems. The slurry and/or the additive liquid may be directly supplied onto the polishing pad as a liquid having a desired water amount or may be diluted on the polishing pad after being supplied onto the polishing pad as a storage liquid having a small water amount. It is to be noted that the same is applied for a polishing liquid in which the constituent components are separated into three liquids or more.

As a polishing device used in the polishing method of the present embodiment, for example, a common polishing device having a holder for holding a base having a material to be polished, and a polishing platen fitted with a motor capable of changing a rotational frequency and the like, and capable of being fitted with a polishing pad, can be used. Examples of the polishing device include a polishing device (model number: EPO-111) manufactured by EBARA CORPORATION, and a polishing device (product name: Mirra3400, Reflexion Polishing Machine) manufactured by Applied Materials, Inc and the like.

The polishing pad is not particularly limited and common non-woven fabric, foamed polyurethane, porous fluorine resin and the like can be used. The polishing pad is preferably subjected to groove processing such that the polishing liquid or the like accumulates therein.

The polishing conditions are not particularly limited, but from the viewpoint of suppressing flying-off of the base, the rotational speed of the polishing platen is preferably a low rotation of 200 $min^{-1}$ (rpm) or less. The pressure (machining load) applied to the base is preferably 100 kPa or less, from the viewpoint of further suppressing generation of polishing scratches. The polishing liquid, the slurry or the like is preferably continuously supplied to the surface of the polishing pad with a pump or the like during polishing. The amount supplied is not particularly limited, but the surface of the polishing pad is preferably covered with the polishing liquid, the slurry or the like at all times. It is preferable that the base after the completion of polishing be washed well in running water, and then dried after removing water droplets adhering to the base with a spin dryer or the like.

EXAMPLES

Hereinafter, the present invention will be described in detail with reference to Examples, but the present invention is not limited thereto.

(Preparation of Abrasive Grains Including Hydroxide of Tetravalent Metal Element)

Abrasive grains including a hydroxide of a tetravalent metal element were prepared in accordance with the following procedure. It is to be noted that the values represented by A to G in the explanation below are values shown in Table 1, respectively.

<Preparation of Abrasive Grains 1 to 2>

After A [L] of water was charged in a container, B [L] of cerium ammonium nitrate aqueous solution having a concentration of 50 mass % (general formula $Ce(NH_4)_2(NO_3)_6$, formula weight 548.2 g/mol, manufactured by NINON KAGAKU SANGYO CO., LTD., product name 50% CAN liquid) was added and mixed. After that, the liquid temperature was adjusted to C [° C.] to obtain a metal salt aqueous solution. The metal salt concentration of the metal salt aqueous solution was as shown in Table 1.

Next, an alkali species shown in Table 1 was dissolved in water to prepare E [L] of an aqueous solution having a concentration of D [mol/L]. After that, the liquid temperature was adjusted to a temperature of C [° C.] to obtain an alkali liquid.

The container containing the above-described metal salt aqueous solution therein was placed in a water tank filled with water. The water temperature of the water tank was adjusted to C [° C.] using an external-circulating device Coolnics Circulator (manufactured by Tokyo Rikakikai Co., Ltd. (EYELA), product name Cooling Thermopump CTP101). The above-described alkali liquid was added into the container at a mixing rate of G [$m^3$/min] while maintaining the water temperature at C [° C.] and stirring the metal salt aqueous solution at a stirring rate of F to obtain a slurry precursor 1 comprising abrasive grains including a hydroxide of tetravalent cerium. It is to be noted that the metal salt aqueous solution was stirred using a 3-bladed pitched paddle having a total blade length of 5 cm.

The obtained slurry precursor 1 was subjected to ultrafiltration while being circulated, using a hollow fiber filter having a cutoff molecular weight of 50000 to remove ion components until the conductivity became 50 mS/m or less, and therefore, a slurry precursor 2 was obtained. It is to be noted that the above-described ultrafiltration was performed while adding water so as to maintain a constant water level of a tank containing the slurry precursor 1, using a fluid level sensor. The content of a non-volatile component (the content of the abrasive grains including a hydroxide of tetravalent cerium) of the slurry precursor 2 was calculated by taking a proper amount of the obtained slurry precursor 2 and measuring the mass before and after drying. It is to be noted that, if the content of the non-volatile component is less than 1.0 mass % at this stage, ultrafiltration was further performed such that it was concentrated to about more than 1.1 mass %.

TABLE 1

| | Metal Salt Solution 50 Mass % | | | Alkali Liquid | | | Manufacturing Parameter | | |
|---|---|---|---|---|---|---|---|---|---|
| | Water Amount A [L] | Metal Salt Liquid Amount B [L] | Concentration [mol/L] | Alkali Species | Concentration D [mol/L] | Liquid Amount E [L] | Synthesis Temperature C [° C.] | Stirring Rate F [min$^{-1}$] | Mixing Rate G [m$^3$/min] |
| Abrasive Grains 1 | 4.968 | 0.143 | 0.037 | Imidazole | 0.7 | 0.912 | 50 | 400 | $1.7 \times 10^{-6}$ |
| Abrasive Grains 2 | 1.656 | 0.048 | 0.037 | Ammonia | 14.7 | 0.016 | 25 | 200 | $2.5 \times 10^{-6}$ |

(Structure Analysis of Abrasive Grains)

A proper amount of the slurry precursor 2 was taken and vacuum dried to isolate abrasive grains. With respect to a sample obtained by being washed well with pure water, measurement by the FT-IR ATR method was performed, and a peak based on a nitrate ion ($NO_{3-}$) was observed in addition to a peak based on a hydroxide ion. Moreover, with respect to the same sample, measurement of XPS for nitrogen (N-XPS) was performed, and a peak based on $NH_4^+$ was not observed and a peak based on a nitrate ion was observed. According to these results, it was confirmed that the abrasive grains comprised in the slurry precursor 2 contain at least a part of particles having a nitrate ion bonded to the cerium element.

(Measurement of Absorbance and Light Transmittance)

A proper amount of the slurry precursor 2 was taken and diluted with water such that the content of the abrasive grains is 0.0065 mass % (65 ppm) to obtain a measuring sample A (aqueous dispersion). Approximately 4 mL of the measuring sample A was poured into a 1-cm square cell, and the cell was placed in a spectrophotometer (device name: U3310) manufactured by Hitachi, Ltd. Absorbance measurement was performed within a range of a wavelength of 200 to 600 nm, and the absorbance for light having a wavelength of 290 nm and the absorbance for light having a wavelength of 450 to 600 nm were measured. The results are shown in Table 2.

A proper amount of the slurry precursor 2 was taken and diluted with water such that the content of the abrasive grains is 1.0 mass % to obtain a measuring sample B (aqueous dispersion). Approximately 4 mL of the measuring sample B was poured into a 1-cm square cell, and the cell was placed in a spectrophotometer (device name: U3310) manufactured by Hitachi, Ltd. Absorbance measurement was performed within a range of a wavelength of 200 to 600 nm, and the absorbance for light having a wavelength of 400 nm and the light transmittance for light having a wavelength of 500 nm were measured. The results are shown in Table 2.

(Measurement of Content of Non-volatile Component of Supernatant Liquid)

A proper amount of the slurry precursor 2 was taken and diluted with water such that the content of the abrasive grains is 1.0 mass % to obtain a measuring sample C (aqueous dispersion). This sample C was filled into a centrifuge tube of an ultracentrifuge manufactured by Hitachi Koki Co., Ltd. (device name: 70P-72), and the ultracentrifuge was used for 50 minutes of centrifugation at a rotational speed of 50000 min$^{-1}$. In the ultracentrifuge, the tube angle was 26° C.; the minimum radius $R_{min}$ was 3.53 cm; the maximum radius $R_{max}$ was 7.83 cm; and the average radius $R_{av}$ was 5.68 cm. The centrifugal acceleration calculated from average radius $R_{av}$ was 158756 G=$1.59 \times 10^5$ G.

After 5.0 g of the supernatant liquid (liquid phase) was sampled from the centrifuge tube after centrifugal separation, the supernatant liquid was placed in an aluminum dish, and dried at 150° C. for 1 hour. The content of a non-volatile component (the content of the abrasive grains including a hydroxide of tetravalent cerium) comprised in the supernatant liquid was calculated by measuring the mass before and after drying. The results are shown in Table 2.

(Measurement of Average Secondary Particle Diameter)

A proper amount of the slurry precursor 2 was taken and diluted with water such that the content of the abrasive grains is 0.2 mass % to obtain a measuring sample D (aqueous dispersion). Approximately 4 mL of the measuring sample D was poured into a 1-cm square cell, and the cell was placed in N5: device name, manufactured by Beckman Coulter, Inc. Measurement was performed at 25° C. with a refractive index and a viscosity of a dispersion medium set to 1.33 and 0.887 mPa·s, and the indicated average particle diameter value was used as the average secondary particle diameter. The results are shown in Table 2.

TABLE 2

| | Absorbance 290 nm Abrasive Grain Content: 65 ppm | Absorbance 450-600 nm | Absorbance 400 nm Abrasive Grains Content: 1.0 mass % | Light Transmittance 500 nm [%/cm] | Content of non-volatile component of Supernatant Liquid [ppm] | Average Secondary Particle Size [nm] |
|---|---|---|---|---|---|---|
| Abrasive Grains 1 | 1.207 | <0.010 | 1.49 | >99 | 812 | 24 |
| Abrasive Grains 2 | 0.754 | <0.010 | 0.89 | 41 | 280 | 95 |

(Preparation of Storage Liquid for Slurry)

Comparative Example 1

Water was added to the slurry precursor 2 comprising the abrasive grains 1 to adjust the total mass to 1000 g, thereby obtaining a storage for a slurry of Comparative Example 1. In the storage liquid 1 for a slurry, the content of the abrasive grains was 1.0 mass %.

Examples 1 to 18 and Comparative Examples 2 to 10

0.23 g of each of compounds shown in Tables 3 or 4 was added to the slurry precursor 2 comprising the abrasive grains 1. Furthermore, a storage liquid 1 for a slurry of each of Examples 1 to 18 and Comparative Examples 2 to 10 was obtained by adding water to adjust the total mass to 1000 g. In the storage liquid 1 for a slurry, the content of the abrasive grains was 1.0 mass %, and the content of each of the compounds shown in Table 3 or 4 was 0.023 mass % (230 ppm).

(Calculation of MK Charge)

The MK charge of the endocyclic nitrogen atom of each compound was calculated in the following manner using the Merz-Kollman method (MK method). After the structure of each compound was input into ChemDraw 7.0, the structure was applied to Chem3D 7.0, and structural optimization was perfomnmed by the molecular mechanics method (MM2). Next, after the obtained data was input into Gaussian 09 (registered trademark manufactured by Gaussian), the MK charge of all endocyclic nitrogen atoms of each compound was calculated by performing structural optimization using a base function B3LYP/6-31G (d). When a plurality of endocyclic nitrogen atoms were present in a molecule, the smallest MK charge was used.

(Measurement of Amount of Change in Conductivity)

After a proper amount of the storage liquid 1 for a slurry was taken and adjusted to 25° C., conductivity (initial conductivity) was measured using an electrical conductivity meter manufactured by Horiba, Ltd. (device name: ES-51). After the storage liquid 1 for a slurry was heated at 60° C. for 72 hours, the conductivity (conductivity after heating) was similarly measured. The difference between these conductivities (conductivity after heating—initial conductivity) was calculated as an amount of change in conductivity. Tables 3 and 4 show the relative value of the amount of change in conductivity when the amount of change in conductivity of the storage liquid 1 for a slurry of Comparative Example 1 (example in which a nitrogen-containing aromatic heterocyclic compound is not added) is set to 1.00.

TABLE 3

| | Compound | MK Charge | Amount of Change in Conductivity (Relative Value) |
|---|---|---|---|
| Example 1 | Imidazole | −0.48 | 0.27 |
| Example 2 | 1,2-Dimethylimidazole | −0.58 | 0.29 |
| Example 3 | 2-Methylimidazole | −0.56 | 0.44 |
| Example 4 | Benzimidazole | −0.63 | 0.63 |
| Example 5 | 1,2,4-Triazole | −0.56 | 0.72 |
| Example 6 | 3-Amino-1,2,4-triazole | −0.64 | 0.52 |
| Example 7 | 3-Amino-1,2,4-triazole-5-carboxylic acid | −0.62 | 0.13 |
| Example 8 | 3-Amino-5-mercapto-1,2,4-triazole | −0.64 | 0.58 |

TABLE 3-continued

| | Compound | MK Charge | Amount of Change in Conductivity (Relative Value) |
|---|---|---|---|
| Example 9 | 3,5-Dimethylpyrazole | −0.52 | 0.54 |
| Example 10 | Pyridine | −0.58 | 0.61 |
| Example 11 | 2-Aminopyridine | −0.67 | 0.24 |
| Example 12 | 3-Aminopyridine | −0.57 | 0.47 |
| Example 13 | 2-Methylpyridine | −0.66 | 0.28 |
| Example 14 | 2-Aminopyrazine | −0.51 | 0.79 |
| Example 15 | 3-Aminopyrazine-2-carboxylic acid | −0.60 | 0.68 |
| Example 16 | Pyrazine carboxylic acid | −0.48 | 0.60 |
| Example 17 | Pyridine-2,6-dicarboxylic acid | −0.57 | 0.62 |
| Example 18 | Imidazole-4,5-dicarboxylic acid | −0.50 | 0.75 |

TABLE 4

| | Compound | MK Charge | Amount of Change in Conductivity (Relative Value) |
|---|---|---|---|
| Comparative Example 1 | — | — | 1.00 (Standard Value) |
| Comparative Example 2 | 1H-Tetrazole | −0.22 | 0.97 |
| Comparative Example 3 | 5-Methyl-1H-tetrazole | −0.40 | 0.94 |
| Comparative Example 4 | 1H-1,2,3-triazole | −0.27 | 1.00 |
| Comparative Example 5 | Pyrazine | −0.41 | 1.00 |
| Comparative Example 6 | Benzotriazole | −0.37 | 0.97 |
| Comparative Example 7 | Indazole-3-carboxylic acid | −0.37 | 0.92 |
| Comparative Example 8 | Nitric acid | N/A | 1.01 |
| Comparative Example 9 | Phthalic acid | N/A | 0.97 |
| Comparative Example 10 | Creatinine | −0.69 | 3.20 |

From the results of Tables 3 and 4, it was found that the amount of the change in conductivity hardly changes in Comparative Examples 8 and 9 using the compound which is not the aromatic heterocyclic compound. It was found that the amount of the change in conductivity is largely increased in Comparative Example 10 using creatinine which is a nitrogen-containing heterocyclic compound but is not an aromatic heterocyclic compound.

Figure 3:
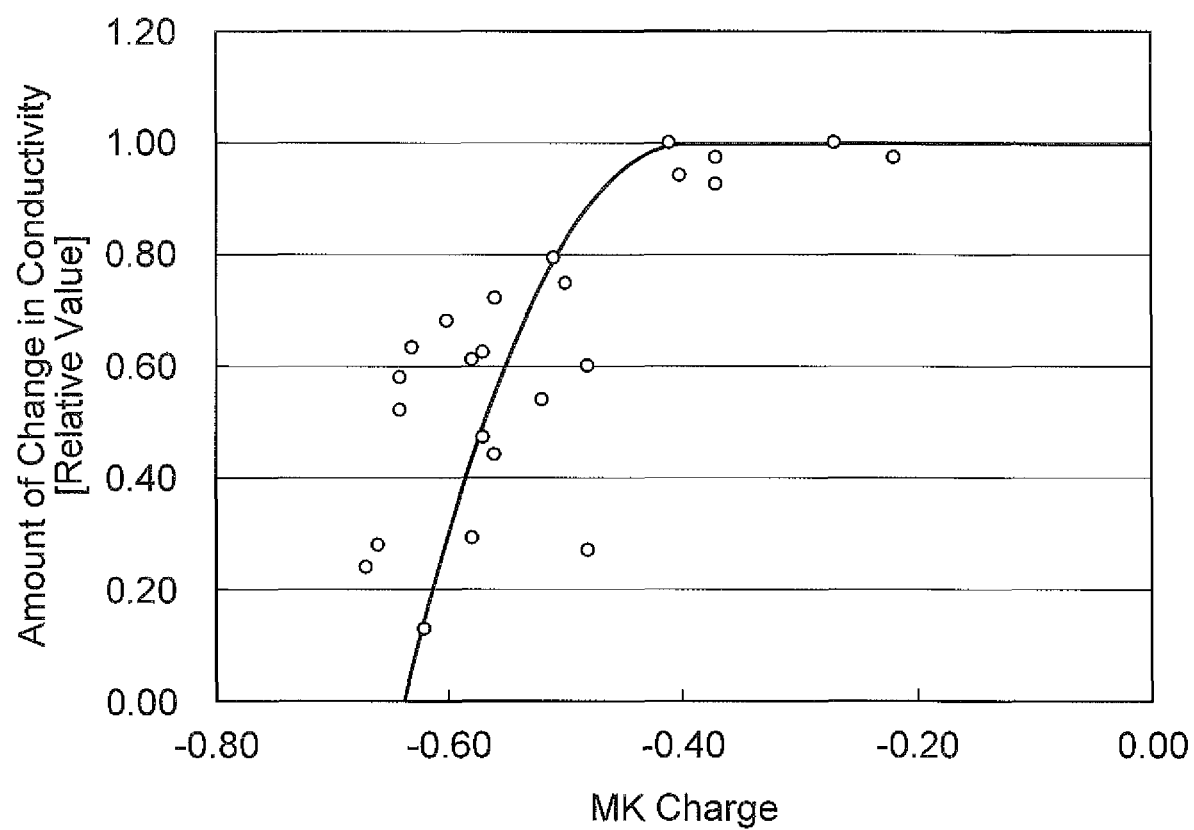
FIG. 3 is a graph showing the relationship between a MK charge and an amount of change in conductivity.

The compound used in each of Examples 1 to 18 and Comparative Examples 2 to 7 is a nitrogen-containing aromatic heterocyclic compound, and has an endocyclic nitrogen atom not bound to a hydrogen atom. FIG. 3 shows the relationship between a MK charge and an amount of change in conductivity for each of Examples 1 to 18 and Comparative Examples 2 to 7. From the results shown in FIG. 3, it was found that the amount of the change in conductivity is remarkably small when in the case where the MK charge was −0.45 or less.

(Preparation of Polishing Liquid)

Pure water and each of compounds shown in Table 5 were added to the slurry precursor 2 comprising the abrasive grains shown in Table 5 to adjust the content of the abrasive grains to 1.0 mass % and adjust the compound content to the content shown in Table 5, thereby obtaining a storage liquid 2 for a slurry. 180 g of pure water was added to 60 g of the storage liquid 2 for a slurry to obtain 240 g of a slurry.

A 5 mass % polyvinyl alcohol aqueous solution was prepared as an additive solution. After adding 60 g of the additive solution to 240 g of the slurry, mixing and stirring were performed. Finally, the pH was adjusted using an ammonia aqueous solution to obtain polishing liquids of Examples 19 to 22 and Comparative Examples 11 to 12. In the polishing liquid, the content of the abrasive grains was 0.2 mass %; the content of polyvinyl alcohol was 1.0 mass %; the content of ammonia was X mass %; and the contents of the compounds were contents shown in Table 5. Herein, the above-described X mass % was determined such that the pH of the polishing liquid was adjusted to 6.0. It is to be noted that the saponification degree of polyvinyl alcohol in the polyvinyl alcohol aqueous solution was 80 mol % and the average degree of polymerization was 300.

(Polishing of Insulating Film)

A ϕ200 mm silicon wafer on which an insulating film (silicon oxide film) is formed was set in a holder of a polishing device (200 mm wafer polishing machine Mirra manufactured by Applied Materials), to which an adsorption pad for mounting a substrate is attached. The holder was placed on a platen to which a porous urethane resin pad is attached such that the insulating film was opposed to the pad. The wafer was pressed against the pad at a polishing load of 20 kPa while supplying the polishing liquid obtained as above onto the pad at an amount supplied of 200 mL/min. At this time, polishing was performed for 1 minute by rotating the platen at 78 min$^{-1}$ and the holder at 98 min$^{-1}$.

(Evaluation of Polishing Rate)

The wafer after polishing was washed with pure water well and then dried. The polishing rate (SiO$_2$ polishing rate) was determined by measuring a change in the insulating film thickness before and after polishing, using a light-interference film thickness meter. The results are shown in Table 5.

(Evaluation of Polishing scratches)

A silicon wafer which had been polished and cleaned under the conditions described above was dipped for 15 seconds in an aqueous solution of 0.5 mass % hydrogen fluoride and then washed with water for 60 seconds. Next, the surface of the insulating film was cleaned for 1 minute using a polyvinyl alcohol brush while supplying water, and then dried. Complus manufactured by Applied Materials, Inc. was used to detect defects of 0.2 μm or more at the surface of the insulating film. Also, upon observation of the surface of the insulating film using the defect detection coordinates obtained by the Complus, and using an SEM Vision manufactured by Applied Materials, Inc., the number of polishing scratches of 0.2 μm or more at the surface of the insulating film was measured. As a result, the number was 0 to 1 per wafer in Examples 19 to 22 and Comparative Example 11, indicating that generation of polishing scratches was adequately suppressed. On the other hand, in Comparative Example 12, polishing scratches of 5 or more per wafer were generated.

TABLE 5

| | Abrasive Grains | Compound | Content of Compound in Left Column [mmol/L] | | pH (Polishing Liquid) | SiO$_2$ Polishing Rate [nm/min] |
| | | | Storage Liquid | Polishing Liquid | | |
|---|---|---|---|---|---|---|
| Example 19 | Abrasive Grains 1 | Pyridine-2,6-dicarboxylic acid | 1.4 | 0.3 | 6.0 | 248 |
| Example 20 | Abrasive Grains 1 | Imidazole-4,5-dicarboxylic acid | 1.5 | 0.3 | 6.0 | 292 |
| Example 21 | Abrasive Grains 1 | 3-Aminopyrazine-2-carboxylic acid | 1.7 | 0.3 | 6.0 | 244 |
| Example 22 | Abrasive Grains 1 | 3-Amino-1,2,4-triazole-5-carboxylic acid | 1.8 | 0.4 | 6.0 | 294 |
| Comparative Example 11 | Abrasive Grains 1 | — | — | — | 6.0 | 290 |
| Comparative Example 12 | Abrasive Grains 2 | — | — | — | 6.0 | 170 |

From these results, in Examples 19 to 22, it was found that polishing rates which are equivalent to that in Comparative Example 11 are obtained, and the polishing scratches can be suppressed. From the comparison of Comparative Examples 11 and 12, it was found that, in the case where the abrasive grains produce the liquid phase having a predetermined content of a non-volatile component when centrifugation is performed under a predetermined condition, produce a predetermined light transmittance for light having a predetermined wavelength, or produce a predetermined absorbance for light having a predetermined wavelength, both a high polishing rate and less polishing scratches can be achieved.

When a silicon wafer on which an insulating film (silicon oxide film) was formed in the same manner as in the above-described method was polished by using 14 kinds of polishing liquids prepared in the same manner as in Examples 19 to 22 except of comprising each of the compounds (Table 3) used in Examples 1 to 6, 8 to 14 and 16 in place of the compounds shown in Table 5, polishing rates which were equivalent to those in Examples 19 to 22 were obtained and generation of polishing scratches was adequately suppressed.

As described above, it was found that the amount of change in conductivity can be reduced without significantly affecting the polishing properties by using the nitrogen-containing aromatic heterocyclic compound having an endocyclic nitrogen atom not bound to a hydrogen atom and having the MK charge of −0.45 or less.

REFERENCE SIGNS LIST

1: wafer, 2: stopper, 3: insulating material, AR: angle rotor, A1: rotation axis, A2: tube angle, R$_{min}$: minimum radius, R$_{max}$: maximum radius, R$_{av}$: average radius

The invention claimed is:

1. A slurry comprising:
   abrasive grains;
   3-amino-1,2,4-triazole-5-carboxylic acid; and
   water, wherein
   the abrasive grains include a hydroxide of a tetravalent metal element, and a content of the abrasive grains is 0.3 mass % or less based on the total mass of the slurry.

2. The slurry according to claim 1, wherein the abrasive grains produce a liquid phase having a content of a non-volatile component of 500 ppm or more when an aqueous dispersion having a content of the abrasive grains adjusted to 1.0 mass % is centrifuged for 50 minutes at a centrifugal acceleration of $1.59 \times 10^5$ G.

3. The slurry according to claim 1, wherein the abrasive grains produce light transmittance of 50%/cm or more for light having a wavelength of 500 nm in an aqueous dispersion having a content of the abrasive grains adjusted to 1.0 mass %.

4. The slurry according to claim 1, wherein the abrasive grains produce absorbance of 1.00 or more for light having a wavelength of 400 nm in an aqueous dispersion having a content of the abrasive grains adjusted to 1.0 mass %.

5. The slurry according to claim 1, wherein the abrasive grains produce absorbance of 1.000 or more for light having a wavelength of 290 nm in an aqueous dispersion having a content of the abrasive grains adjusted to 0.0065 mass %.

6. The slurry according to claim 1, wherein the abrasive grains produce absorbance of 0.010 or less for light having a wavelength of 450 to 600 nm in an aqueous dispersion having a content of the abrasive grains adjusted to 0.0065 mass %.

7. The slurry according to claim 1, wherein the hydroxide of a tetravalent metal element is obtained by reacting a salt of a tetravalent metal element with an alkali source.

8. The slurry according to claim 1, wherein the tetravalent metal element is tetravalent cerium.

9. A polishing-liquid set wherein constituent components of a polishing liquid are separately stored as a first liquid and a second liquid such that the first liquid and the second liquid are mixed to form the polishing liquid, the first liquid is the slurry according to claim 1, and the second liquid comprises an additive, excluding a compound having an aromatic heterocycle, and water, wherein
the aromatic heterocycle has an endocyclic nitrogen atom not bound to a hydrogen atom, and
a charge of the endocyclic nitrogen atom obtained by using Merz-Kollman method is −0.45 or less.

10. The slurry according to claim 1, wherein a content of 3-amino-1,2,4-triazole-5-carboxylic acid is 0.01 mmol/L or more based on the total mass of the slurry.

11. The slurry according to claim 1, wherein an amount of change over time in conductivity of the slurry is 25 mS/m or less.

12. The slurry according to claim 1, wherein a content of the hydroxide of a tetravalent metal element is 0.3 mass % or less based on the total mass of the slurry.

13. A polishing method for a base, comprising:
a step of arranging a material to be polished of a base having the material to be polished on its surface so as to be opposed to a polishing pad, and
a step of supplying the slurry according to claim 1 between the polishing pad and the material to be polished and polishing at least a part of the material to be polished.

14. A polishing method for a base, comprising:
a step of arranging a material to be polished of a base having the material to be polished on its surface so as to be opposed to a polishing pad,
a step of obtaining the polishing liquid by mixing the first liquid and the second liquid of the polishing-liquid set according to claim 9, and
a step of supplying the polishing liquid between the polishing pad and the material to be polished and polishing at least a part of the material to be polished.

15. A polishing method for a base, comprising:
a step of arranging a material to be polished of a base having the material to be polished on its surface so as to be opposed to a polishing pad, and
a step of supplying each of the first liquid and the second liquid of the polishing-liquid set according to claim 9 between the polishing pad and the material to be polished and polishing at least a part of the material to be polished.

16. The polishing method according to claim 13, wherein the material to be polished includes silicon oxide.

17. The polishing method according to claim 13, wherein a surface of the material to be polished has irregularities.

18. The polishing method according to claim 14, wherein the material to be polished includes silicon oxide.

19. The polishing method according to claim 14, wherein a surface of the material to be polished has irregularities.

20. The polishing method according to claim 15, wherein the material to be polished includes silicon oxide.

21. The polishing method according to claim 15, wherein a surface of the material to be polished has irregularities.

22. A polishing liquid comprising:
abrasive grains;
3-amino-1,2,4-triazole-5-carboxylic acid;
an additive, excluding a compound having an aromatic heterocycle; and
water, wherein
the abrasive grains include a hydroxide of a tetravalent metal element,
a content of the abrasive grains is 0.3 mass % or less based on the total mass of the polishing liquid,
the aromatic heterocycle has an endocyclic nitrogen atom not bound to a hydrogen atom, and
a charge of the endocyclic nitrogen atom obtained by using Merz-Kollman method is −045 or less.

23. The polishing liquid according to claim 22, wherein the abrasive grains produce a liquid phase having a content of a non-volatile component of 500 ppm or more when an aqueous dispersion having a content of the abrasive grains adjusted to 1.0 mass % is centrifuged for 50 minutes at a centrifugal acceleration of $1.59 \times 10^5$ G.

24. The polishing liquid according to claim 22, wherein the abrasive grains produce light transmittance of 50%/cm or more for light having a wavelength of 500 nm in an aqueous dispersion having a content of the abrasive grains adjusted to 1.0 mass %.

25. The polishing liquid according to claim 22, wherein the abrasive grains produce absorbance of 1.00 or more for light having a wavelength of 400 nm in an aqueous dispersion having a content of the abrasive grains adjusted to 1.0 mass %.

26. The polishing liquid according to claim 22, wherein the abrasive grains produce absorbance of 1,000 or more for light having a wavelength of 290 nm in an aqueous dispersion having a content of the abrasive grains adjusted to 0.0065 mass %.

27. The polishing liquid according to claim 22, wherein the abrasive grains produce absorbance of 0.010 or less for light having a wavelength of 450 to 600 nm in an aqueous dispersion having a content of the abrasive grains adjusted to 0.0065 mass %.

28. The polishing liquid according to claim 22, wherein the hydroxide of a tetravalent metal element is obtained by reacting a salt of a tetravalent metal element with an alkali source.

29. The polishing liquid according to claim 22, wherein the tetravalent metal element is tetravalent cerium.

30. The polishing liquid according to claim 22, wherein a content of 3-amino-1,2,4-triazole-5-carboxylic acid is 0.01 mmol/L or more based on the total mass of the polishing liquid.

31. The polishing liquid according to claim 22, wherein an amount of change over time in conductivity of the polishing liquid is 25 mS/m or less.

32. The polishing liquid according to claim 22, wherein a pH of the polishing liquid is more than 5.0 and 9.0 or less.

33. The polishing liquid according to claim 22, wherein a pH of the polishing liquid is 6.0-9.0.

34. The polishing liquid according to claim 22, wherein a content of the hydroxide of a tetravalent metal element is 0.3 mass % or less based on the total mass of the polishing liquid.

35. A polishing method of a base, comprising:
a step of arranging a material to be polished of a base having the material to be polished on its surface so as to be opposed to a polishing pad, and
a step of supplying the polishing liquid according to claim 22 between the polishing pad and the material to be polished and polishing at least a part of the material to be polished.

36. The polishing method according to claim 35, wherein the material to be polished includes silicon oxide.

37. The polishing method according to claim 35, wherein a surface of the material to be polished has irregularities.

* * * * *